(12) United States Patent
Morisue et al.

(10) Patent No.: US 8,293,593 B2
(45) Date of Patent: Oct. 23, 2012

(54) METHOD FOR MANUFACTURING SEMICONDUCTOR DEVICE AND METHOD FOR MANUFACTURING DISPLAY DEVICE

(75) Inventors: Masafumi Morisue, Kawasaki (JP); Koichiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/777,580

(22) Filed: May 11, 2010

(65) Prior Publication Data

US 2010/0219413 A1    Sep. 2, 2010

Related U.S. Application Data

(63) Continuation of application No. 11/896,031, filed on Aug. 29, 2007, now Pat. No. 7,851,250.

(30) Foreign Application Priority Data

Aug. 31, 2006 (JP) ................................. 2006-235519

(51) Int. Cl.
*H01L 21/00* (2006.01)
(52) U.S. Cl. ..................................................... 438/149
(58) Field of Classification Search .................. 438/149
See application file for complete search history.

(56) References Cited

U.S. PATENT DOCUMENTS

| 4,861,964 A | 8/1989 | Sinohara |
| 5,555,112 A | 9/1996 | Oritsuki et al. |
| 5,708,252 A | 1/1998 | Shinohara et al. |
| 6,149,988 A | 11/2000 | Shinohara et al. |
| 6,788,368 B2 | 9/2004 | Takahashi et al. |
| 6,987,596 B2 | 1/2006 | Otagiri et al. |
| 7,034,976 B2 | 4/2006 | Otagiri et al. |
| 7,196,832 B2 | 3/2007 | Otagiri et al. |
| 7,491,557 B2 | 2/2009 | Park |
| 7,579,224 B2 | 8/2009 | Kuwabara et al. |

(Continued)

FOREIGN PATENT DOCUMENTS

CN    1427287    7/2003

(Continued)

OTHER PUBLICATIONS

Office Action (Application No. 200710142266.X) Dated Apr. 26, 2010.

*Primary Examiner* — Charles Garber
*Assistant Examiner* — Andre' C Stevenson
(74) *Attorney, Agent, or Firm* — Eric J. Robinson; Robinson Intellectual Property Law Office, P.C.

(57) ABSTRACT

An object is to provide a method for manufacturing a highly-reliable semiconductor device with an improved material use efficiency and with a simplified manufacturing process. The method includes the steps of forming a conductive layer over a substrate, forming a light-transmitting layer over the conductive layer, and selectively removing the conductive layer and the light-transmitting layer by irradiation with a femtosecond laser beam from above the light-transmitting layer. Note that the conductive layer and the light-transmitting layer may be removed so that an end portion of the light-transmitting layer is located on an inner side than an end portion of the conductive layer. Before the irradiation with a femtosecond laser beam, a surface of the light-transmitting layer may be subjected to liquid-repellent treatment.

20 Claims, 20 Drawing Sheets

U.S. PATENT DOCUMENTS

| | | |
|---|---|---|
| 7,630,115 B2 | 12/2009 | Otagiri et al. |
| 7,692,378 B2 | 4/2010 | Yamazaki |
| 7,868,957 B2 | 1/2011 | Yamazaki et al. |
| 2001/0046081 A1* | 11/2001 | Hayashi et al. ............... 359/296 |
| 2002/0100608 A1 | 8/2002 | Fushie et al. |
| 2006/0081844 A1 | 4/2006 | Hirosue et al. |
| 2006/0289872 A1* | 12/2006 | Miyazawa ..................... 257/72 |
| 2011/0097834 A1 | 4/2011 | Yamazaki et al. |

FOREIGN PATENT DOCUMENTS

| | | |
|---|---|---|
| CN | 1469690 | 1/2004 |
| CN | 1770937 | 5/2006 |
| EP | 0613038 A | 8/1994 |
| JP | 06-250211 A | 9/1994 |
| JP | 2000-133636 | 5/2000 |
| JP | 2004-297011 A | 10/2004 |
| JP | 2005-210083 A | 8/2005 |
| JP | 2006-100324 A | 4/2006 |
| JP | 2006-135289 | 5/2006 |
| WO | WO-2005/055309 | 6/2005 |

* cited by examiner 8500
8501
8502

METHOD FOR MANUFACTURING SEMICONDUCTOR DEVICE AND METHOD FOR MANUFACTURING DISPLAY DEVICE

BACKGROUND OF THE INVENTION

1. Field of the Invention

The present invention relates to a method for manufacturing a semiconductor element, which employs contact hole opening with the use of a femtosecond laser. The present invention also relates to a method for manufacturing a semiconductor device that includes a semiconductor element.

2. Description of the Related Art

In a thin film transistor (hereinafter also referred to as a TFT) and an electronic circuit using the thin film transistor, various thin films such as a semiconductor film, an insulating film, and a conductive film are stacked over a substrate, and they are appropriately processed to have predetermined contact holes by a photolithography technique. The photolithography technique is a technique in which a pattern of a circuit or the like which is formed over a transparent flat plate by using a material that does not transmit light, which is referred to as a photomask, is transferred to a target substrate by using light. The photolithography technique is widely used in a manufacturing process of a semiconductor integrated circuit and the like. Then, a contact hole can be formed in a desired position by removing a part of an insulating film, a semiconductor film, a metal film, or the like in a portion to be a contact hole while using, as a mask, a pattern which is transferred to a substrate by a photolithography technique.

The conventional manufacturing process using the photolithography technique requires multiple steps such as exposure, development, baking, and peeling only for treating a mask pattern formed by using a photosensitive organic resin material that is also referred to as a photoresist. Therefore, the manufacturing cost is inevitably increased as the number of photolithography steps is increased. In order to solve this problem, it has been attempted to manufacture TFTs through a smaller number of photolithography steps (Reference 1: Japanese Published Patent Application No. 2000-133636). In Reference 1, a resist mask formed through a photolithography step is used once and is then reused as a resist mask having a different shape by expansion in its volume by swelling.

SUMMARY OF THE INVENTION

However, the employment of the photolithography step requires at least five treatment steps that are photosensitizer application, patterning, developing treatment, etching treatment, and peeling treatment. Therefore, it takes time to complete the step, so that the amount of production is decreased. In addition, various chemicals such as a photosensitizer resist, a developing solution used for development, and a stripper solution used for peeling are used. Therefore, a harmful waste liquid is generated during the step, and not only a cost of chemicals but also a disposal cost of a waste liquid is added to the manufacturing cost. Furthermore, environmental pollution with the chemicals is also considered to be caused in some cases.

A defect in shape of a conductive layer formed in a contact hole formed using the photolithography step results in defective contact between conductive layers that are connected through the contact hole and causes decreases in yield and reliability of a resulting semiconductor device. In particular, in forming a wiring layer for forming a circuit, defective contact of the wiring layer has an adverse effect on electrical characteristics, such as short circuiting.

It is an object of the present invention to provide a technique for eliminating a photolithography step in a manufacturing process of a TFT, a semiconductor device using the TFT, and a display device including the TFT, to further simplify the process and to improve production capacity. It is another object of the present invention to provide a method for forming a component of the display device such as a wiring in a desired shape with high controllability.

A feature of the present invention is to form an opening portion (contact hole) in an insulating layer and a conductive layer by using a femtosecond laser and to form a conductive layer to cover the opening portion by discharging a liquid conductive material into the opening portion.

One aspect of the present invention is a method for manufacturing a semiconductor device, which includes the steps of forming a conductive layer over a substrate, forming a light-transmitting layer over the conductive layer, and selectively removing the conducive layer and the light-transmitting layer by irradiation with a femtosecond laser beam from above the light-transmitting layer.

Another aspect of the present invention is a method for manufacturing a semiconductor device, which includes the steps of forming a conductive layer over a substrate, forming a light-transmitting layer over the conductive layer, forming an opening portion in the conductive layer and the light-transmitting layer by selectively removing the conductive layer and the light-transmitting layer by irradiation with a femtosecond laser beam from above the light-transmitting layer, and dropping a liquid conductive material into the opening portion.

In the method for manufacturing a semiconductor device of the present invention, the conductive layer and the light-transmitting layer may be removed so that an end portion of the light-transmitting layer is located on an inner side than an end portion of the conductive layer.

Another aspect of the present invention is a method for manufacturing a semiconductor device, which includes the steps of forming a first conductive layer over a substrate, forming a light-transmitting layer over the first conductive layer, forming an opening portion in the first conductive layer and the light-transmitting layer by selectively removing the first conductive layer and the light-transmitting layer by irradiation with a femtosecond laser beam from above the light-transmitting layer, and forming a second conductive layer to be electrically connected to the first conductive layer by dropping a liquid conductive material into the opening portion.

In the method for manufacturing a semiconductor device of the present invention, the first conductive layer and the light-transmitting layer may be removed so that an end portion of the light-transmitting layer is located on an inner side than an end portion of the first conductive layer.

In the method for manufacturing a semiconductor device of the present invention, a liquid-repellent treatment may be performed on a surface of the light-transmitting layer.

The present invention can be applied to a display device that is a device having a display function. The display device to which the present invention is applied includes, in its category, a light-emitting display device where a light-emitting element in which a layer containing an organic substance, an inorganic substance, or a mixture of an organic substance and an inorganic substance, which exhibits light emission called electroluminescence (hereinafter also referred to as EL), is interposed between electrodes is connected to a TFT; a liquid crystal display device which uses a liquid crystal element containing a liquid crystal material as a display element; and the like.

In each of the above aspects, the conductive layer where the opening portion is formed can be formed using one or more of chromium, molybdenum, nickel, titanium, cobalt, copper, and aluminum. In addition, the light-transmitting layer where the opening portion is formed can be formed using a material which transmits a femtosecond laser beam, such as a light-transmitting organic resin layer.

According to the present invention, a complicated photolithography step can be eliminated, and a semiconductor device can be manufactured through a simplified process. Therefore, material loss can be reduced and cost reduction can be achieved. Accordingly, a high-performance and high-reliability display device can be manufactured with high yield.

DETAILED DESCRIPTION OF THE INVENTION

Figure 1A:
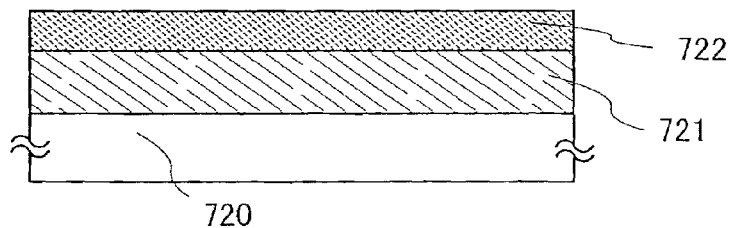
FIGS. 1A to 1E are cross-sectional views illustrating a method for manufacturing a semiconductor device of the present invention.

Embodiment modes of the present invention will hereinafter be described in detail with reference to the accompanying drawings. Note that the present invention is not limited to the following description. As is easily known to a person skilled in the art, the mode and the detail of the present invention can be variously changed without departing from the spirit and the scope of the present invention. Therefore, the present invention is not interpreted as being limited to the following description in the embodiment modes. Note that the same portions or portions having a similar function in different diagrams are denoted by the same reference numeral in the structure of the present invention to be described below, and repetitive description thereof is omitted.

Embodiment Mode 1

This embodiment mode describes a method for forming an opening portion (contact hole) with the use of a femtosecond laser and for forming a conductive layer to cover the opening portion by discharging a liquid conductive material into the opening portion.

First, a conductive layer 721 is formed over a substrate 720 (FIG. 1A). Note that the conductive layer 721 can be formed using a single layer or a stacked layer of a material which includes an element selected from, for example, titanium (Ti), aluminum (Al), tantalum (Ta), tungsten (W), molybdenum (Mo), copper (Cu), chromium (Cr), neodymium (Nd), iron (Fe), nickel (Ni), cobalt (Co), ruthenium (Ru), rhodium (Rh), palladium (Pd), osmium (Os), iridium (Ir), silver (Ag), gold (Au), platinum (Pt), cadmium (Cd), zinc (Zn), silicon (Si), germanium (Ge), zirconium (Zr), and barium (Ba).

Next, a light-transmitting layer 722 is formed over the conductive layer 721 (FIG. 1A). Here, the light-transmitting layer 722 is not particularly limited as long as it is a thin film formed of a material that transmits laser light. For example, the light-transmitting layer 722 can be formed using a light-transmitting organic resin layer or the like. In addition, a surface of the light-transmitting layer 722 may be subjected to liquid-repellent treatment.

Figure 1B:
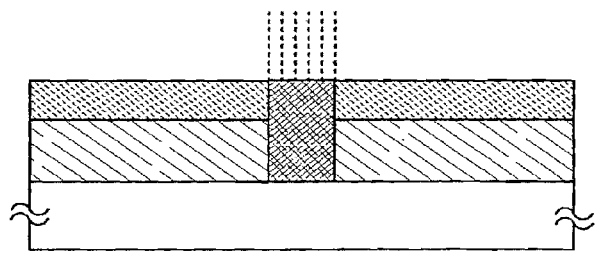
Figure 1C:
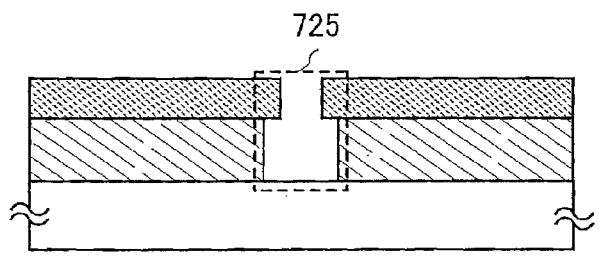

Next, irradiation with a femtosecond laser beam is performed from above the light-transmitting layer 722 (FIG. 1B). By irradiation of the surface of the light-transmitting layer 722 with a femtosecond laser beam, the conductive layer 721 and the light-transmitting layer 722 can be removed selectively (FIG. 1C). In other words, an opening portion 725 can be selectively formed in the conductive layer 721 and the light-transmitting layer 722. Here, the femtosecond laser beam is adjusted so that its focus is positioned in the light-transmitting layer 722 or the conductive layer 721. Note that when the position of the focus changes due to substrate unevenness, an optical system may have an auto-focus function. Even when the irradiation with a femtosecond laser beam is performed so that the focus of the femtosecond laser beam is positioned in the light-transmitting layer 722, since the light-transmitting layer 722 is thin, it is difficult to selectively remove only the light-transmitting layer 722. Therefore, the conductive layer 721 located below is also removed together, and accordingly, the opening portion 725 is formed in the conductive layer 721 and the light-transmitting layer 722. Further, when the opening portion is formed by irradiation with a femtosecond laser beam as described above, the opening portion 725 can be formed with an end portion of the light-transmitting layer 722 located on an inner side of the opening portion 725 than an end portion of the conductive layer 721. Such a shape achieves an increase in exposed area of the conductive layer 721 while maintaining a small diameter of the opening portion. Thus, an opening portion with a small diameter can be formed by stacking the conductive layer 721 and the light-transmitting layer 722 and forming the opening portion with a femtosecond laser beam. Even with such an opening portion, a favorable connection structure can be formed by formation of contact with the use of a conductive resin material.

Note that the femtosecond laser beam for irradiation is emitted from a laser oscillator that emits light with a pulse width of femtoseconds ($10^{-15}$ seconds) (also referred to as a femtosecond laser). Examples of the laser oscillators are lasers in each of which a dopant such as Nd, Yb, Cr, Ti, Ho, or Er is added to a crystal such as sapphire, YAG, ceramic YAG ceramic $Y_2O_3$, KGW, KYW, $Mg_2SiO_4$, YLF, $YVO_4$, or $GdVO_4$, and the like.

Since the opening portion 725 can be selectively formed by a laser beam in this embodiment mode, a mask layer does not necessarily need to be formed. Accordingly, steps and materials can be reduced. In addition, since the use of a femtosecond laser enables a laser beam to be collected to a very small spot, a conductive layer and an insulating layer can be processed into a predetermined shape with high accuracy. Further, heating is instantaneously performed in a short time; thus, there is an advantage that there is almost no necessity to heat a region other than a process region. Furthermore, the use of a femtosecond laser facilitates the processing of a substance that transmits light (substance that hardly absorbs light). Moreover, multilayer stacked films of different materials can be processed in a single step.

Figure 1D:
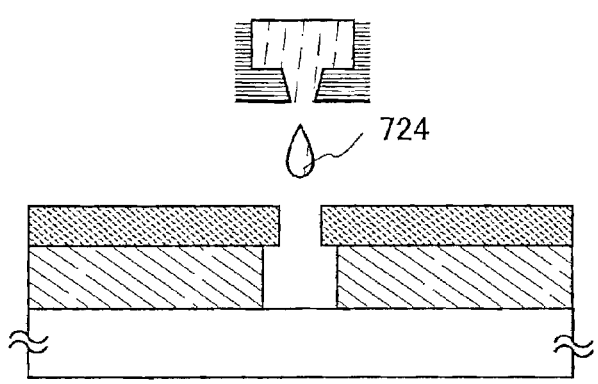
Figure 1E:
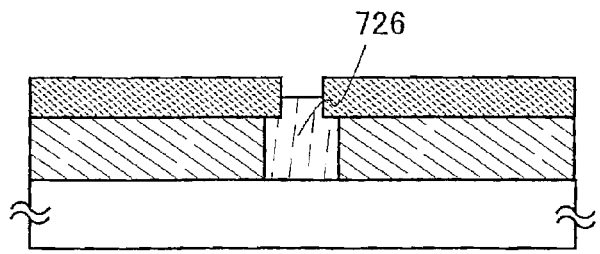

Next, a liquid conductive material 724 is dropped into the opening portion 725 (FIG. 1D). Here, a droplet discharge (ejection) method (also referred to as an ink jet method depending on its system) is used which is capable of forming a conductive layer and the like into a predetermined pattern by selectively discharging (ejecting) droplets of a composition prepared for a specific purpose. A liquid conductive material (droplet) 724 including a component-forming material is discharged into the opening portion 725 and fixed by baking, drying, and the like to form a conductive layer 726 in a desired pattern (FIG. 1E).

Figure 2:
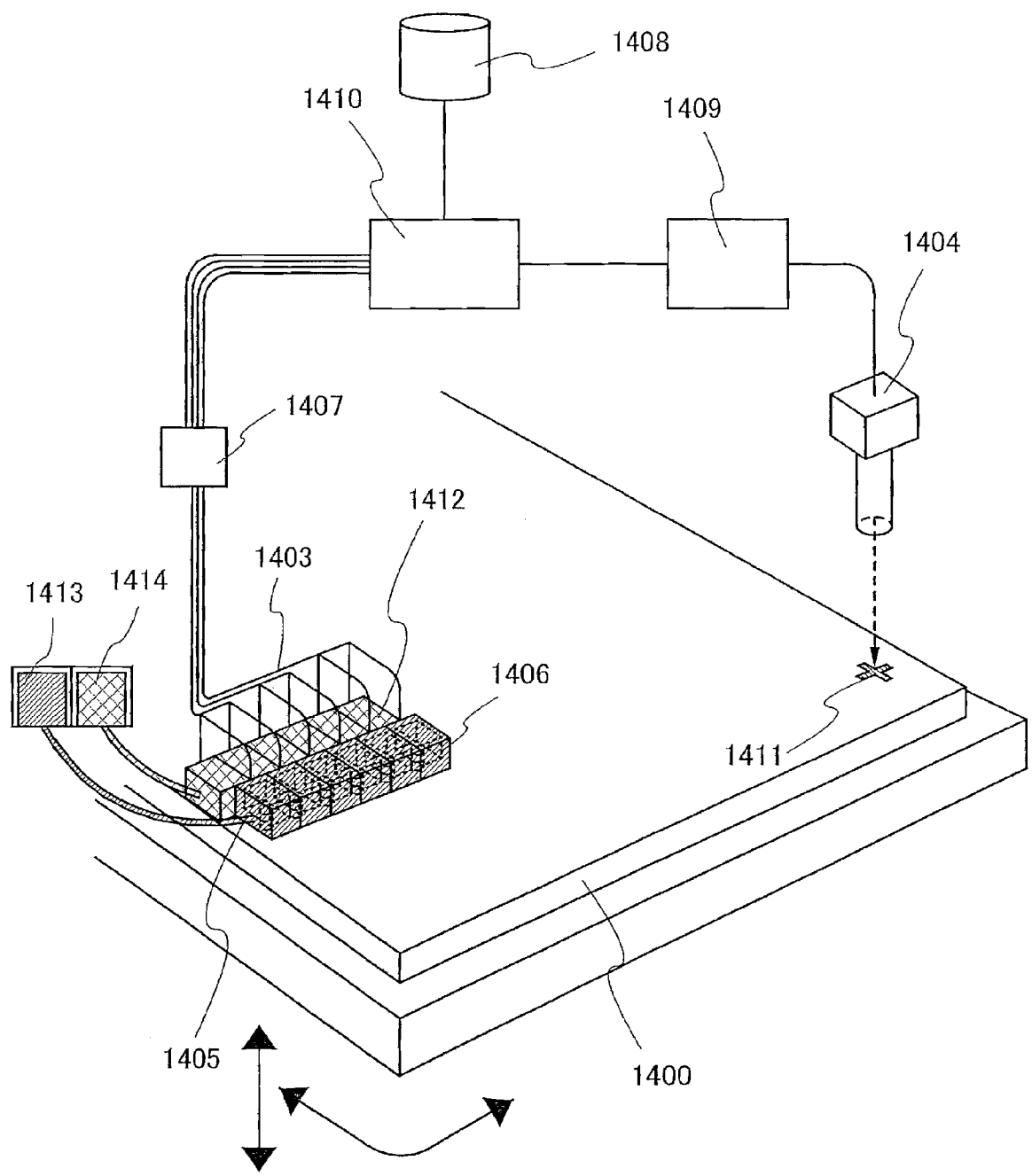
FIG. 2 is a diagram illustrating a method for manufacturing a semiconductor device of the present invention.

Here, FIG. 2 shows one mode of a droplet discharge apparatus that is used for a droplet discharge method. Each of heads 1405 and 1412 of a droplet discharge unit 1403 is connected to a control unit 1407, and this control unit 1407 is controlled by a computer 1410, so that a preprogrammed pattern can be formed. The formation position may be determined based on, for example, a marker 1411 that is fainted over a substrate 1400. Alternatively, a reference point may be determined based on an edge of the substrate 1400. The reference point is detected by an imaging unit 1404 and converted into a digital signal by an image processing unit 1409. Then, the digital signal is recognized by the computer 1410 to generate a control signal, and the control signal is transmitted to the control unit 1407. A charge coupled device (CCD), an image sensor using a complementary metal oxide semiconductor, or the like can be used as the imaging unit 1404. Naturally, information about a pattern to be formed over the substrate 1400 is stored in a storage medium 1408, and the control signal is transmitted to the control unit 1407 based on this information, so that the heads 1405 and 1412 of the droplet discharge unit 1403 can be controlled individually. Materials to be discharged are supplied to the heads 1405 and 1412 from material supply sources 1413 and 1414 through pipes, respectively.

The head 1405 has an internal structure which includes a space filled with a liquid material as indicated by a dotted line 1406 and a nozzle that is a discharge opening. Although not shown, the head 1412 also has an internal structure similar to that of the head 1405. When the nozzle sizes of the heads 1405 and 1412 are different from each other, different materials can be simultaneously drawn to have different widths. Also, a conductive material, an organic material, an inorganic material, and the like can each be discharged from one head. In the case of drawing over a large area such as an interlayer film, one material can be simultaneously discharged from a plurality of nozzles in order to improve throughput, and thus, drawing can be performed. When a large-sized substrate is used, the heads 1405 and 1412 can freely move over the substrate in directions indicated by arrows in FIG. 2, and a drawing region can be freely set. Thus, a plurality of the same patterns can be drawn over one substrate.

In the case of forming a conductive layer by a droplet discharge method, the conductive layer is formed as follows: a composition containing a conductive material which has been processed into particulate form is discharged, and the composition is fused or welded by baking to be solidified. Many of conductive layers (or insulating layers) formed by a sputtering method or the like have a columnar structure, whereas many of conductive layers (or insulating layers) formed by discharging and baking the composition containing a conductive material as described above have a polycrystalline structure having a large number of grain boundaries.

In this embodiment mode, the opening portion 725 is formed in the light-transmitting layer 722 with the use of a femtosecond laser, and the conductive layer 726 is formed in the opening portion 725 by a droplet discharge method. Accordingly, an opening portion can be formed without performing a complicated photolithography step, and the conductive layer 726 can have favorable electrical contact with the conductive layer 721 below the light-transmitting layer 722 without being affected by the shape of the opening portion. For example, even when the opening portion 725 is formed so that the end portion of the light-transmitting layer 722 is located on an inner side than the end portion of the conductive layer 721 (when the opening portion 725 has an inversed tapered shape) or the opening portion is narrow/small, the conductive layer 726 is formed in the opening portion by discharging a liquid conductive material. Therefore, the conductive layer 726 can have favorable electrical contact with the conductive layer 721.

In this embodiment mode, the surface of the light-transmitting layer 722 may be subjected to liquid-repellent treatment before irradiation with a femtosecond laser beam. The liquid-repellent treatment performed on the surface of the light-transmitting layer 722 can prevent, when forming the conductive layer 726 in the opening portion 725, the liquid conductive material (droplet) 724 from being deposited on the surface of the light-transmitting layer 722 without entering the opening portion 725 and can make the conductive material 724 flow into the opening portion 725 with higher accuracy.

Embodiment Mode 2

This embodiment mode describes a method for manufacturing a semiconductor device using the method of Embodiment Mode 1 with reference to FIGS. 3A to 3F.

Here, description is given using an inverted-staggered thin film transistor (inverted-staggered TFT) as an example of a semiconductor device. Without limitation to the inverted-staggered thin film transistor, it is also possible to manufacture a semiconductor element such as a staggered thin film transistor, a coplanar thin film transistor, a diode, or a MOS transistor.

Figure 3A:
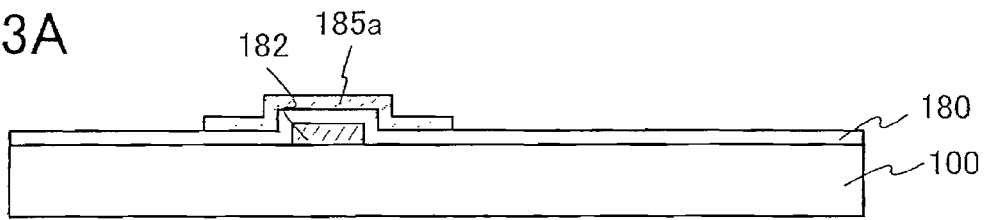
FIGS. 3A to 3F are cross-sectional views illustrating a method for manufacturing a semiconductor device of the present invention.

First, a gate electrode layer 182 is formed over a substrate 100 (FIG. 3A). The substrate 100 can be a glass substrate of barium borosilicate glass, alumino borosilicate glass, or the like, a quartz substrate, a metal substrate, or a plastic substrate that has heat resistance enough to withstand a treatment temperature during this manufacturing process. In addition, a surface of the substrate 100 may be polished by a CMP method or the like so as to be planarized. Note that an insulating layer may be formed over the substrate 100. The insulating layer is formed as a single layer or a stacked layer using an oxide material or a nitride material containing silicon by any of various methods such as a CVD method, a plasma CVD method, a sputtering method, and a spin coating method. This insulating layer does not necessarily need to formed, but it is effective in blocking a contaminant and the like from the substrate 100.

The gate electrode layer 182 can be formed by forming a conductive layer using a sputtering method, a PVD (Physical Vapor Deposition) method, a CVD (Chemical Vapor Deposition) method such as a low pressure CVD (LPCVD) method or a plasma CVD method, or the like and then selectively etching the conductive film through a photolithography step. The gate electrode layer 182 can be formed using a conductive material such as an element selected from Ag, Au, Ni, Pt, Pd, Ir, Rh, Ta, W, Ti, Mo, Al, and Cu, or an alloy or compound material containing the above element as its main component. Alternatively, a semiconductor film typified by a polycrystalline silicon film doped with an impurity element such as phosphorus, or an AgPdCu alloy may be used. The gate electrode layer 182 may have either a single layer structure or a multilayered structure; for example, it may have a two-layer structure of a tungsten nitride film and a molybdenum (Mo) film or a three-layer structure in which a tungsten film having a thickness of 50 nm, an alloy film of aluminum and silicon having a thickness of 500 nm, and a titanium nitride film having a thickness of 30 nm are sequentially laminated. Further, in the case of the three-layer structure, a tungsten nitride film may be used instead of the tungsten film as a first conductive film, an alloy film of aluminum and titanium may be used instead of the alloy film of aluminum and silicon as a second conductive film, and a titanium film may be used instead of the titanium nitride film as a third conductive film.

In this embodiment mode, the gate electrode layer is selectively formed by discharging a composition. The selective formation of the gate electrode layer as described above is effective in simplifying processing steps.

Next, a gate insulating layer 180 is formed over the substrate 100 and the gate electrode layer 182 (FIG. 3A). The gate insulating layer 180 may be formed as a single layer or a stacked layer using a material such as an oxide material or a nitride material of silicon. In this embodiment mode, a two-layer structure of a silicon nitride film and a silicon oxide film is employed. Alternatively, a single layer thereof or of a silicon oxynitride film, or a stacked layer of three or more layers may be employed. Preferably, a silicon nitride film having dense film quality is used. In the case where silver, copper, or the like is used for a conductive layer formed by a droplet discharge method, when a silicon nitride film or a NiB film is formed thereover as a barrier film, the film has the effect of preventing impurity diffusion and surface planarization. In order to form a dense insulating film with less gate leak current at low formation temperature, a reaction gas containing a rare gas element such as argon may be mixed into an insulating film to be formed. Here, a silicon nitride layer with a thickness of 50 nm to 200 nm is formed by a plasma CVD method.

Next, a semiconductor layer 185a is formed over the gate insulating layer 180 over the substrate 100. The semiconductor layer 185a can be formed using a material such as an amorphous semiconductor (hereinafter also referred to as "AS") which is formed by a vapor deposition method using a semiconductor source gas typified by silane or germane or by a sputtering method, a polycrystalline semiconductor which is formed by crystallizing the amorphous semiconductor using light energy or thermal energy, or a semi-amorphous semiconductor (also referred to as a microcrystal semiconductor or "SAS"). Note that the semiconductor layer 185a can be formed using a droplet discharge method by which a layer having a predetermined shape is formed by discharging droplets of a prepared composition from minute pores. Alternatively, it may be formed using a printing method. Still alternatively, the semiconductor layer 185a may be formed by forming a semiconductor layer over the substrate by a CVD method, a PVD method, a coating method, or the like and then selectively etching the conductive layer through a photolithography step.

As a typical example of an amorphous semiconductor, hydrogenated amorphous silicon can be given. As a typical example of a crystalline semiconductor, polysilicon or the like can be given. Polysilicon (polycrystalline silicon) includes so-called high-temperature polysilicon formed using polysilicon which is formed at processing temperatures of 800° C. or more as its main component, so-called low-temperature polysilicon formed using polysilicon which is formed at processing temperatures of 600° C. or less as its main component, polysilicon formed by adding an element which promotes crystallization and by crystallization, and the like. Of course, a semi-amorphous semiconductor or a semiconductor which includes a crystalline phase in a portion thereof can also be used.

Note that a SAS is a semiconductor having an intermediate structure between amorphous and crystalline (including single crystal and polycrystalline) structures and a third state which is stable in terms of free energy. Moreover, a SAS includes a crystalline region with a short-range order and lattice distortion. A crystalline region of 0.5 nm to 20 nm can be observed at least in a portion of a film. In the case where silicon is contained as a main component, Raman spectrum is shifted to the low wave number side that is lower than 520 $cm^{-1}$. The diffraction peaks of (111) and (220), which are considered to be derived from silicon crystal lattice, are observed by X-ray diffraction. A SAS contains hydrogen or halogen by at least 1 atomic % or more for terminating dangling bonds. A SAS is formed by glow discharge decomposition (plasma CVD) of a gas containing silicon. As the gas containing silicon, $SiH_4$ can be used, and alternatively, $Si_2H_6$, $SiH_2Cl_2$, $SiHCl_3$, $SiCl_4$, $SiF_4$, or the like can be used. Further, $F_2$ or $GeF_4$ may be mixed. The gas containing silicon may be diluted with $H_2$, or $H_2$ and one or a plurality of kinds of rare gas elements of He, Ar, Kr, and Ne. The dilution ratio is 1:2 to 1:1000, pressure is approximately 0.1 Pa to 133 Pa, and a power source frequency is 1 MHz to 120 MHz, preferably, 13 MHz to 60 MHz. A temperature for heating the substrate is preferably 300° C. or less, and a SAS can also be formed at 100° C. to 200° C. It is preferable that the concentration of impurities of atmospheric components such as oxygen, nitrogen, and carbon as impurity elements in the film be $1 \times 10^{20}$ cm$^{-3}$ or less. In particular, an oxygen concentration is preferably 5×10$^{19}$ cm$^{-3}$ or less, and more preferably, 1×10$^{19}$ cm$^{-3}$ or less. Further, when a rare gas element such as helium, argon, krypton, or neon is contained to further promote the lattice distortion, a favorable SAS with higher stability can be obtained. Further, as the semiconductor layer, a SAS layer formed by using a hydrogen-based gas may be stacked over a SAS layer formed by using a fluorine-based gas.

When a crystalline semiconductor layer is used for the semiconductor layer, the crystalline semiconductor layer may be formed by any of various methods such as a laser crystallization method, a thermal crystallization method, and a thermal crystallization method using an element such as nickel which promotes crystallization. Further, a microcrystalline semiconductor that is a SAS may be crystallized by laser irradiation to enhance crystallinity. In the case where an element which promotes crystallization is not used, before the amorphous silicon film is irradiated with a laser beam, the amorphous silicon film is heated at 500° C. for one hour in a nitrogen atmosphere to discharge hydrogen so that a hydrogen concentration in the amorphous silicon film becomes 1×10$^{20}$ atoms/cm$^3$ or less. This is because, if the amorphous silicon film contains much hydrogen, the amorphous silicon film may be damaged by laser irradiation.

A method for introducing a metal element into the amorphous semiconductor layer is not particularly limited as long as it is capable of introducing the metal element to a surface of or inside the amorphous semiconductor layer. For example, a sputtering method, a CVD method, a plasma treatment method (including a plasma CVD method), an adsorption method, or a method for applying a solution of metal salt can be used. Among them, a method using a solution is simple and advantageous in that the concentration of the metal element can easily be adjusted. At this time, it is desirable to form an oxide film by UV light irradiation in an oxygen atmosphere, a thermal oxidation method, treatment with ozone water containing hydroxyl radicals or hydrogen peroxide, or the like to improve wettability of the surface of the amorphous semiconductor layer so that an aqueous solution spreads over the entire surface of the amorphous semiconductor layer.

In order to crystallize the amorphous semiconductor layer, heat treatment may be combined with crystallization by laser irradiation, or one of heat treatment and laser beam irradiation may be carried out multiple times. Moreover, the crystalline semiconductor layer may be directly formed over the substrate by a plasma method.

The semiconductor layer may be formed using an organic semiconductor material by a printing method, a dispenser method, a spray method, a spin coating method, a droplet discharge method, or the like. In this case, since the etching step is not necessary, the number of steps can be reduced. As the organic semiconductor, a low-molecular material, a high-molecular material, or the like can be used. Alternatively, an organic dye, a conductive high-molecular material, or the like can be used. As the organic semiconductor material used in the present invention, a π-electron conjugated high-molecular material of which skeleton includes a conjugated double bond is desirable. Typically, polythiophene, polyfluorene, poly(3-alkylthiophene), polythiophene derivatives, pentacene, or the like can be used.

In addition, as the organic semiconductor material which can be used in the present invention, there is a material with which the semiconductor layer can be formed by forming a soluble precursor and then performing a process thereon. The organic semiconductor material through a precursor includes polythienylenevinylene, poly(2,5-thienylenevinylene), polyacetylene, polyacetylene derivatives, polyallylenevinylene, and the like.

The precursor is changed into the organic semiconductor not only by heat treatment but also by addition of a reaction catalyst such as a hydrogen chloride gas. Moreover, as a typical solvent for dissolving the soluble organic semiconductor material, toluene, xylene, chlorobenzene, dichlorobenzene, anisole, chloroform, dichloromethane, γ-butyl-lactone, butylcellosolve, cyclohexane, N-methyl-2-pyrrolidone (NMP), cyclohexanone, 2-butanon, dioxane, dimethylformamide (DMF), tetrahydrofuran (THF), and the like can be used.

Figure 3B:
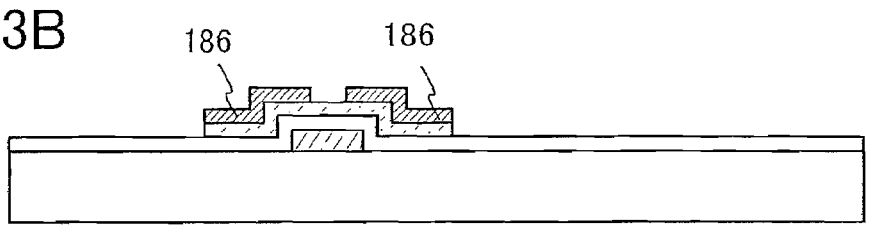

Next, a semiconductor layer 186 having one conductivity type is formed over the semiconductor layer 185a (FIG. 3B). The semiconductor layer 186 having one conductivity type functions as a source region and a drain region. Note that the semiconductor layer having one conductivity type may be formed as needed, and a semiconductor film having n-type conductivity containing an impurity element imparting n-type conductivity (P, As) or a semiconductor film having p-type conductivity containing an impurity element imparting p-type conductivity (B) can be formed. Alternatively, the semiconductor layer 186 having one conductivity type may be formed using a droplet discharge method by which a layer having a predetermined shape is formed by discharging droplets of a prepared composition from minute pores, or may be formed using a printing method. Still alternatively, the semiconductor layer 186 having one conductivity type may be Mimed by being formed over the substrate by a CVD method, a PVD method, a coating method, or the like and then being selectively etched through a photolithography step.

Figure 3C:
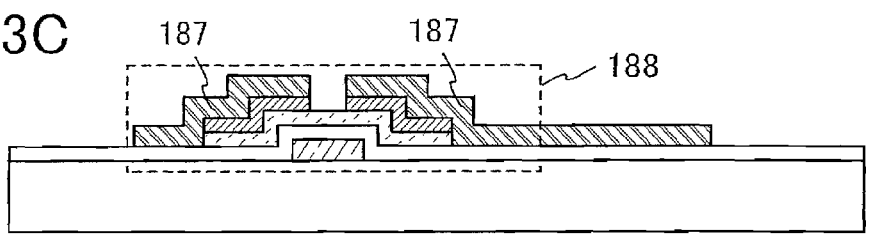

Next, a wiring 187 is formed over the semiconductor layer 186 having one conductivity type (FIG. 3C). The wiring 187 can be formed by dropping a conductive paste by a droplet discharge method and baking the conductive paste. Alternatively, it may be formed by a printing method. Still alternatively, the wiring 187 may be formed by forming a conductive layer over the substrate by a CVD method, a PVD method, a coating method, or the like and then selectively etching the conductive layer through a photolithography step.

The wiring 187 functions as a source electrode layer or a drain electrode layer, and is electrically connected to the semiconductor layer 186 having one conductivity type. The wiring 187 can be formed using a composition that contains particles of a metal such as silver (Ag), gold (Au), copper (Cu), tungsten (W), or aluminum (Al) as its main component. Alternatively, indium tin oxide (ITO), indium tin oxide containing silicon oxide (ITSO), organic indium, organic tin, zinc oxide, titanium oxide, or the like which has a light-transmitting property may be combined.

In addition, the formation using a droplet discharge method can prevent material loss and achieve cost reduction as compared to the formation by overall coating using a spin coating method or the like.

Figure 3D:
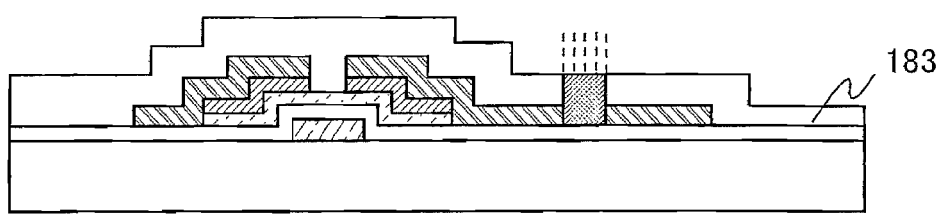

Next, an insulating layer 183 is formed over the wiring 187 (FIG. 3D). The insulating layer 183 is not particularly limited as long as it is a light-transmitting layer formed of a material that transmits laser light. For example, the wiring 187 may be a film including one or more kinds of an inorganic material (such as silicon oxide, silicon nitride, silicon oxynitride, or silicon nitride oxide), a photosensitive or non-photosensitive organic material (organic resin material) (such as polyimide, acrylic, polyimide, polyimide amide, resist, or benzocyclobutene), a low dielectric constant material, and the like, a stacked layer of these films, or the like. Alternatively, a siloxane material may be used. Further, a surface of the insulating layer 183 may be subjected to liquid-repellent treatment.

Figure 3E:
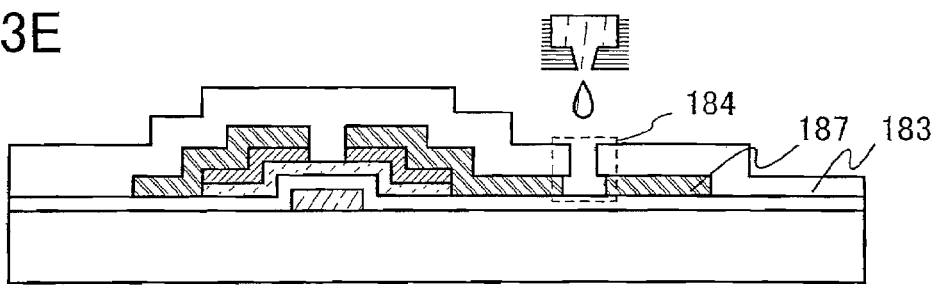

Next, an opening portion 184 is fanned in the insulating layer 183 (FIG. 3E). In this embodiment mode, the opening portion 184 can be formed in a desired position of the wiring 187 and the insulating layer 183 by irradiating the desired position with a femtosecond laser beam as described in Embodiment Mode 1.

Figure 3F:
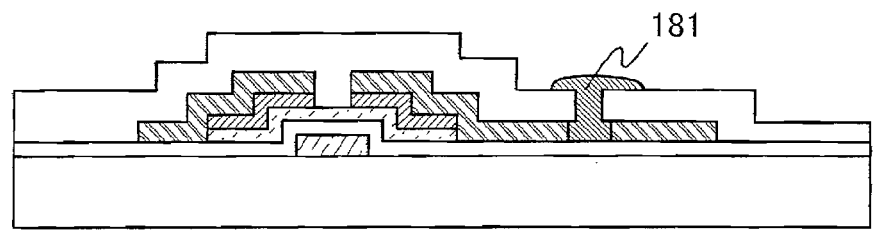

Next, an electrode layer 181 is formed in the opening portion 184 by discharging a composition containing a conductive material (FIGS. 3E and 3F). The selective formation of the electrode layer by discharge of a composition is effective in simplifying processing steps.

Note that the electrode layer 181 may be cleaned or polished by a CMP method or with the use of a porous material based on polyvinyl alcohol, so that the surface thereof is planarized. In addition, after the polishing by a CMP method, the surface of the electrode layer 181 may be subjected to ultraviolet light irradiation, oxygen plasma treatment, or the like.

Through the above steps, a semiconductor element is completed in which a bottom-gate thin film transistor 188 and the electrode layer 181 are connected to each other over the substrate 100.

In this embodiment mode, the opening portion 184 is formed in the insulating layer 183 with the use of a femtosecond laser, and the electrode layer 181 is formed in the opening portion 184 by a droplet discharge method. Since the opening portion is formed using a femtosecond laser in this embodiment mode, the opening portion can be formed in a single step without a photolithography step in forming the opening portion in a conductive layer and an insulating layer, for which a complicated photolithography step is conventionally needed. In addition, since the electrode layer 181 covering the opening portion is formed using a droplet discharge method, the electrode layer 181 can have favorable electrical contact with the wiring 187 below the insulating layer without being affected by the shape of the opening portion. For example, even when the opening portion 184 is formed so that an end portion of the insulating layer 183 is located on an inner side than an end portion of the wiring 187 (when the opening portion has an inversed tapered shape) or the opening portion is narrow/small, the electrode layer 181 is formed by discharging a liquid conductive material into the opening portion. Therefore, the electrode layer 181 can have favorable electrical contact with the wiring 187.

In this embodiment mode, the surface of the insulating layer 183 may be subjected to liquid-repellent treatment before irradiation with a femtosecond layer beam. The liquid-repellent treatment performed on the surface of the insulating layer 183 can prevent, when forming the electrode layer 181 in the opening portion 184, a liquid conductive material (droplet) from being formed on the surface of the insulating layer 183 without entering the opening portion 184 and can make the conductive material flow into the opening portion 184 with higher accuracy.

By using the method for manufacturing a semiconductor device described in this embodiment mode, an opening (contact hole) between wirings can be formed without using a complicated photolithography step, and the wirings can have favorable electrical contact. Accordingly, a high-performance and high-reliability semiconductor device can be manufactured with less material loss and with high yield.

Embodiment Mode 3

This embodiment mode describes a method for manufacturing a semiconductor device that includes a conductive layer connected to a thin film transistor, with reference to FIGS. 4A to 4D. Here, a liquid-crystal display panel is formed as a semiconductor device. FIGS. 4A to 4D show cross-sectional views of one pixel of a liquid-crystal display panel, which will be described below.

Figure 4A:
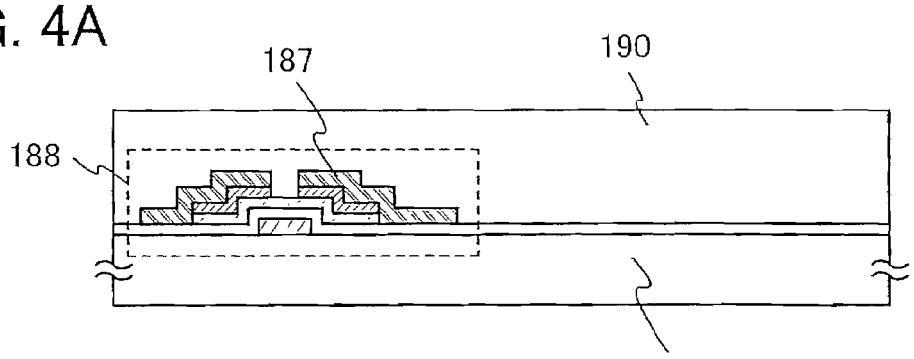
FIGS. 4A to 4D are cross-sectional views illustrating a method for manufacturing a semiconductor device of the present invention.

As shown in FIG. 4A, the thin film transistor 188 described in Embodiment Mode 2 and an insulating layer 190 covering the thin film transistor 188 are formed over the substrate 100. Here, the insulating layer 190 is formed of polyimide by applying a composition by a coating method and baking the composition.

Next, an opening portion is provided in a part of the insulating layer 190 by the method described in Embodiment Mode 1 with the use of a femtosecond laser, and thus the insulating layer 190 having an opening portion is formed. Then, an oxide formed on a surface of the wiring 187 may be removed.

Figure 4B:
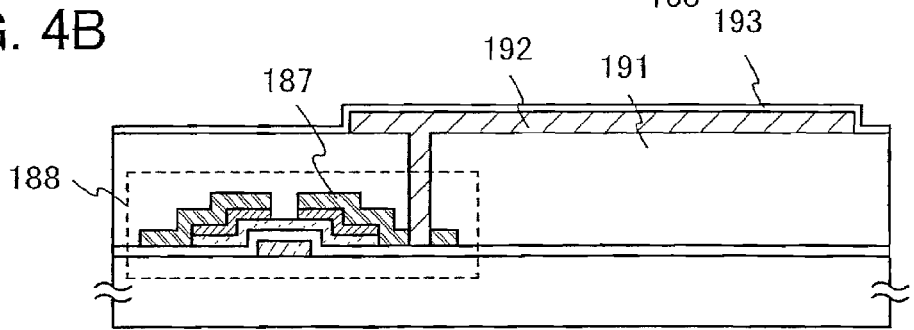

Next, as shown in FIG. 4B, a conductive layer 192 connected to the wiring 187 is formed in the opening portion and over a surface of the insulating layer 190. Note that the conductive layer 192 functions as a pixel electrode and is selectively formed using a droplet discharge method. By forming a light-transmitting conductive layer as the conductive layer 192, a transmissive light-emitting display panel can be manufactured later. Further, by forming a reflective conductive layer of silver (Ag), gold (Au), copper (Cu), tungsten (W), aluminum (Al), or the like as the conductive layer 192, a reflective light-emitting display panel can be manufactured later. Furthermore, by alternately forming a light-transmitting conductive layer and a reflective conductive layer pixel to pixel, a semi-transmissive display panel can be manufactured.

Note that as shown in FIG. 4B, the opening portion can be formed so that a surface of the wiring 187 is in contact with the conductive layer 192.

Figure 4C:
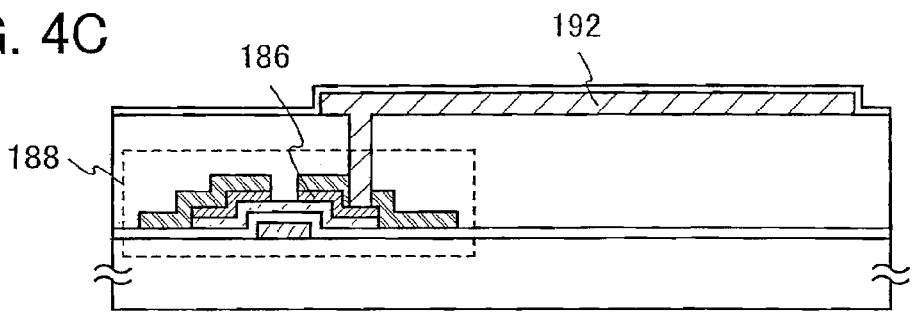

In addition, as shown in FIG. 4C, the opening portion can be formed so that a surface of the semiconductor layer 186 having one conductivity type is in contact with the conductive layer 192.

Through the above steps, an active-matrix substrate can be formed.

Figure 4D:
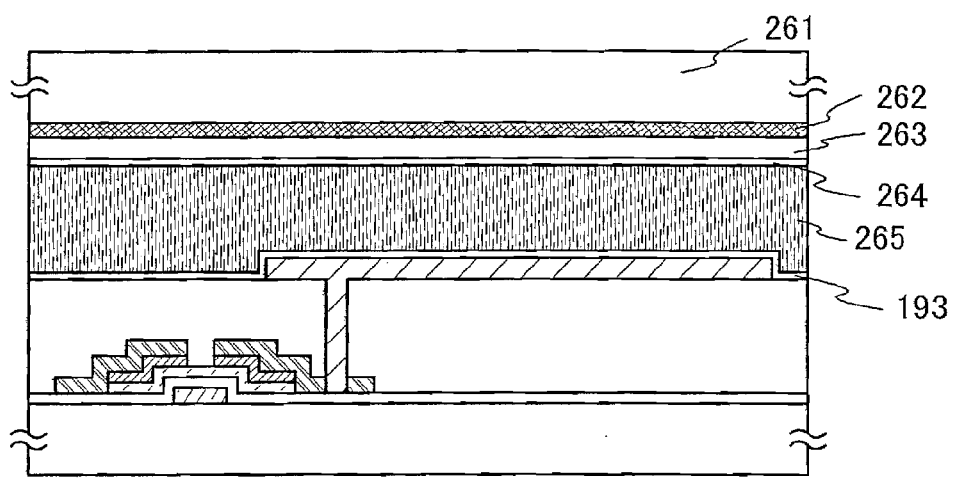

Next, an insulating film is formed by a printing method or a spin coating method and subjected to rubbing to form an orientation film 193 (FIG. 4D). Note that the orientation film 193 can also be formed by an oblique evaporation method.

Next, over an opposite substrate 261 which is provided with an orientation film 264, a second pixel electrode (opposite electrode) 263, and a colored layer 262, a closed-loop sealant (not shown) is formed by a droplet discharge method in a peripheral region of a pixel portion. A filler may be mixed into the sealant, and a color filter, a blocking film (black matrix), or the like may be formed over the opposite substrate 261.

Next, a liquid crystal material is dropped by a dispenser method (dropping method) to the inside of the closed loop formed by the sealant; the opposite substrate and the active-matrix substrate are attached to each other in vacuum; and ultraviolet curing is performed. Accordingly, a liquid crystal layer 265, which fills a space between the opposite substrate and the active-matrix substrate, is formed. Note that instead of the dispenser method (dropping method), the liquid crystal layer 265 can be formed using a dipping method (pumping method) by which a liquid crystal material is injected utilizing a capillary phenomenon after attaching the opposite substrate.

Then, a wiring board, typically an FPC (Flexible Printed Circuit) is attached to a connection terminal portion of scan lines or signal lines with a connection conductive layer interposed therebetween. Through the above steps, a liquid crystal display panel can be formed.

In this embodiment mode, a TN liquid crystal panel is shown; however, the above process can be similarly applied to liquid crystal panels of other modes. For example, this embodiment mode can be applied to an in-plane switching liquid crystal panel in which liquid crystals are aligned by application of an electric field parallel to a glass substrate. Further, this embodiment mode can be applied to a VA (Vertical Alignment) liquid crystal panel.

Figure 5:
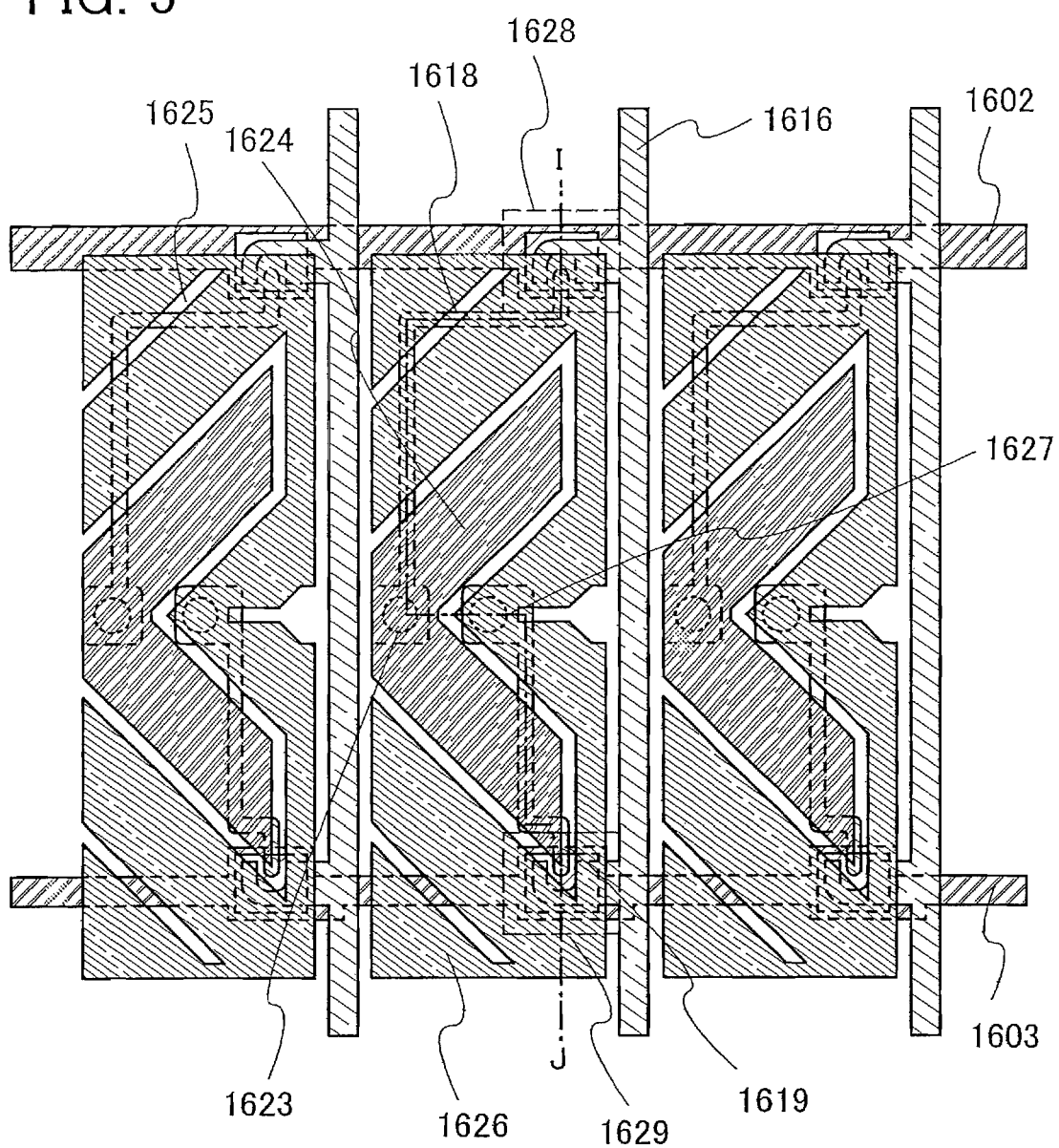
FIG. 5 is a diagram illustrating a method for manufacturing a semiconductor device of the present invention.
Figure 6:
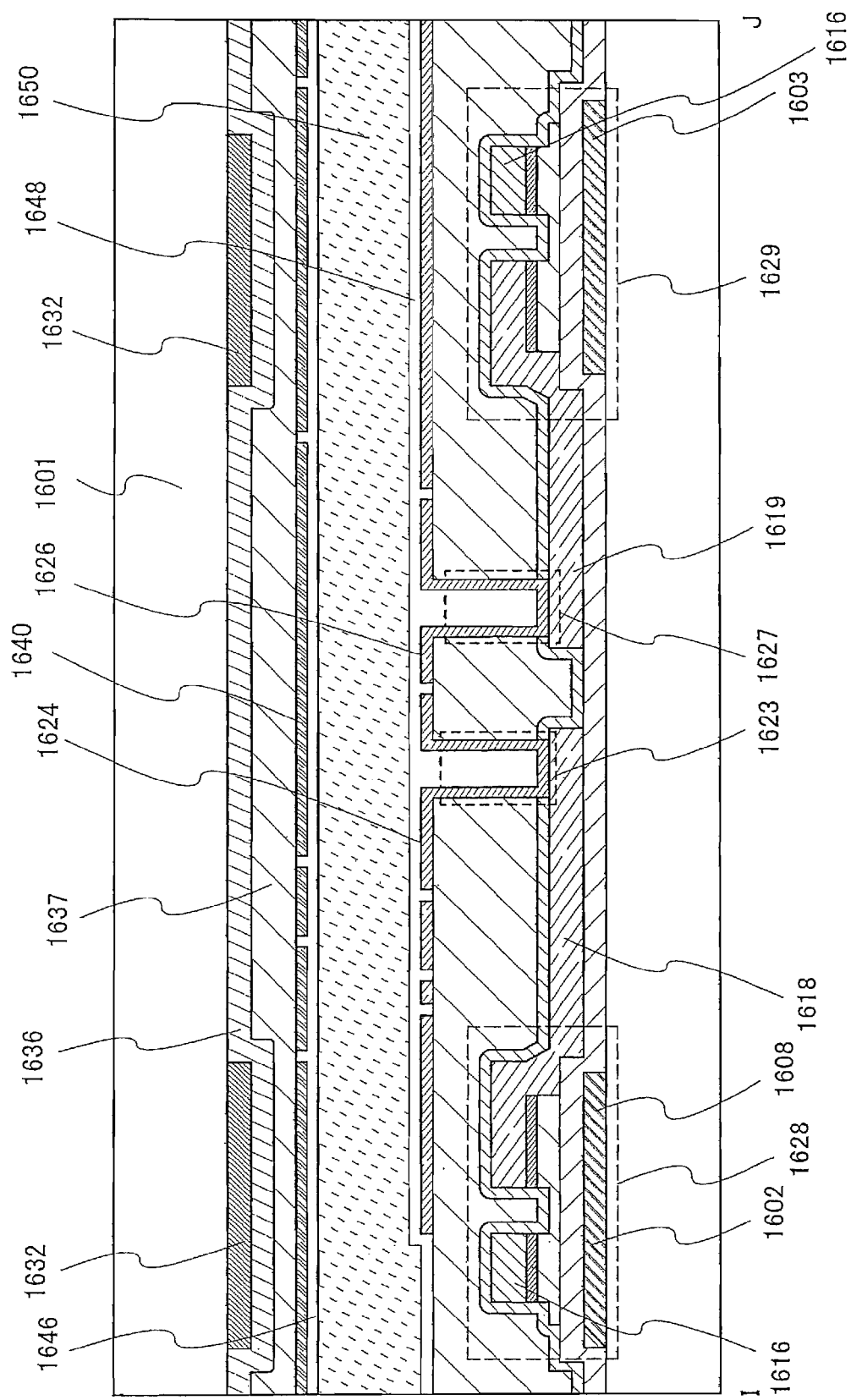
FIG. 6 is a cross-sectional view illustrating a method for manufacturing a semiconductor device of the present invention.

FIGS. 5 and 6 show a pixel structure of a VA liquid crystal panel. FIG. 5 shows a top view, and FIG. 6 shows a cross-sectional structure taken along a line I-J. In the following description, both of these drawings are used.

In this pixel structure, a plurality of pixel electrodes are provided in each pixel, and each pixel electrode is connected to a TFT. TFTs are each structured so as to be driven by different gate signals. In other words, a multi-domain pixel has a structure in which signals applied to pixel electrodes are independently controlled.

A pixel electrode layer 1624 is connected to a TFT 1628 by a wiring layer 1618 through an opening (contact hole) 1623. A pixel electrode layer 1626 is connected to a TFT 1629 by a wiring layer 1619 through an opening (contact hole) 1627. A gate wiring layer 1602 of the TFT 1628 and a gate electrode layer 1603 of the TFT 1629 are separated from each other so that different gate signals can be applied thereto. On the other hand, a wiring layer 1616 functioning as a data line is used by both the TFTs 1628 and 1629.

The pixel electrode layers 1624 and 1626 are formed as in Embodiment Mode 1 through two droplet discharge steps. Specifically, a first composition containing a conductive material is discharged along a contour of a pattern of the pixel electrode layer by a first droplet discharge step, and thus, a first conductive layer having a frame shape is formed. A second composition containing a conductive material is discharged so as to fill a space inside the frame formed of the first conductive layer by a second droplet discharge step, and thus, a second conductive layer is formed. The first and second conductive layers can be used as one continuous pixel electrode layer, whereby the pixel electrode layers 1624 and 1626 can be formed. Since the process can be simplified and material loss can be prevented by the present invention as described above, a display device can be manufactured at low cost with high productivity.

Figure 7:
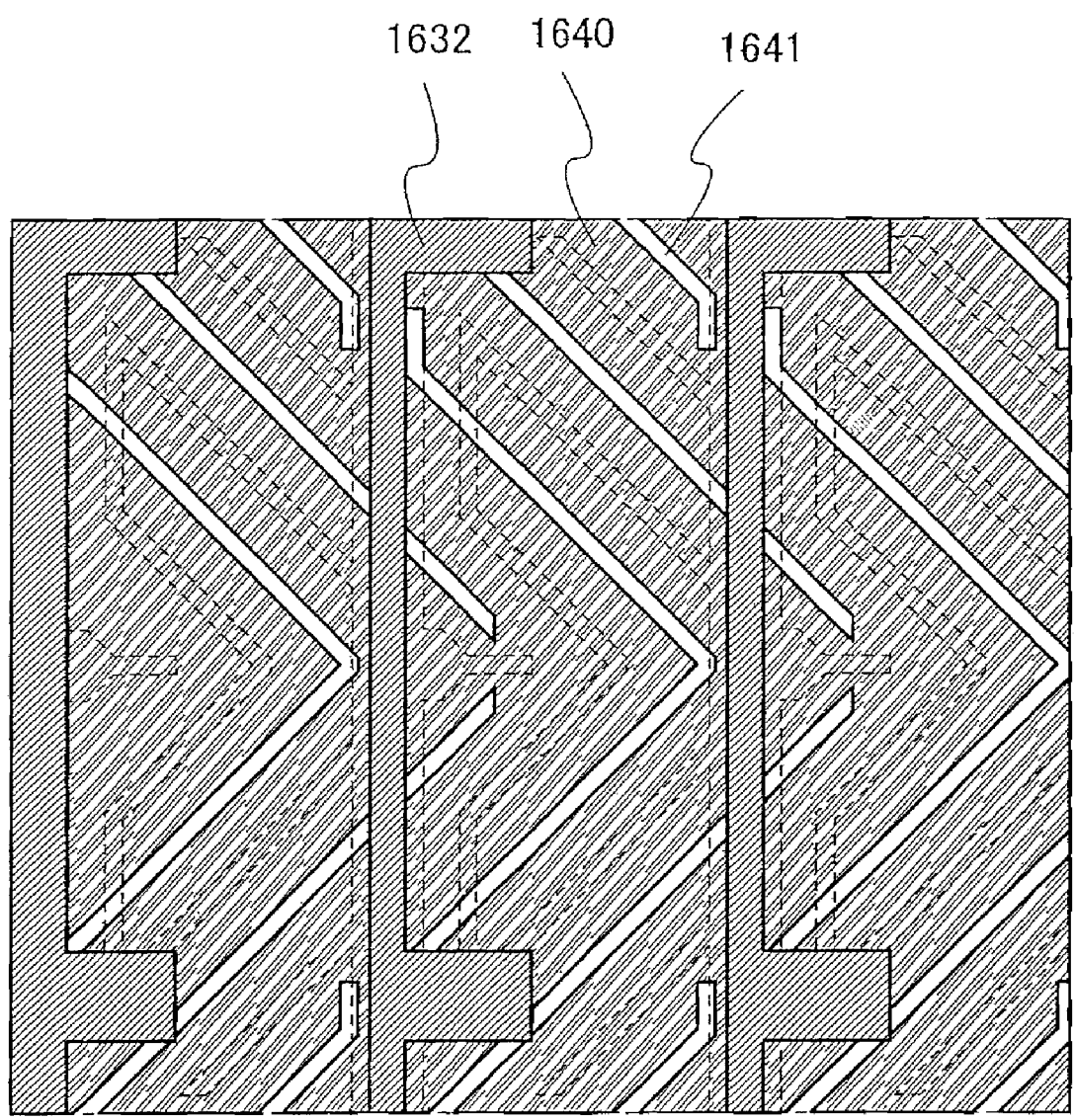
FIG. 7 is a diagram illustrating a method for manufacturing a semiconductor device of the present invention.

The shapes of the pixel electrode layers 1624 and 1626 are different, and the pixel electrode layers 1624 and 1626 are separated by a slit 1625. The pixel electrode layer 1626 is formed so as to surround the pixel electrode layer 1624 that spreads out into a V shape. Timings of voltage application to the pixel electrode layers 1624 and 1626 are made different for the TFTs 1628 and 1629, whereby alignment of liquid crystals is controlled. A light-blocking film 1632, a colored layer 1636, and an opposite electrode layer 1640 are formed on an opposite substrate 1601. A planarizing film 1637 is formed between the colored layer 1636 and the opposite electrode layer 1640, so that alignment disorder of liquid crystals is prevented. FIG. 7 shows a structure on the opposite substrate side. The opposite electrode layer 1640 is used by different pixels in common, in which a slit 1641 is formed. This slit 1641 and the slit 1625 on the side of the pixel electrode layers 1624 and 1626 are arranged so as to be alternately engaged with each other, and thus, an oblique electric field can be effectively generated and alignment of liquid crystals can be controlled. Accordingly, an alignment direction of the liquid crystals can be varied depending on the place; therefore, the viewing angle can be widened.

As described above, a liquid crystal panel can be manufactured using a composite material of an organic compound and an inorganic compound for a pixel electrode layer. With the use of such a pixel electrode layer, it is not necessary to use a transparent conductive film containing indium as its main component, and bottleneck of materials can be overcome.

This embodiment mode can be freely combined with any of the above-described embodiment modes.

Note that a protective circuit for prevention of electrostatic discharge damage, typically a diode or the like, may be provided between a connection terminal and a source wiring (gate wiring) or in the pixel portion. In this case, electrostatic discharge damage can be prevented by manufacturing a diode through a similar process to that of the above-described TFT and connecting a gate wiring layer of the pixel portion and a drain or source wiring layer of the diode.

By using the method for manufacturing a liquid crystal display panel described in this embodiment mode, an opening (contact hole) between wirings can be formed without using a complicated photolithography step, and favorable electrical contact of wirings can be obtained. Accordingly, a high-performance and high-reliability liquid crystal display panel can be manufactured with less material loss and with high yield.

Embodiment Mode 4

This embodiment mode describes a method for manufacturing a semiconductor device including a conductive layer which is connected to a thin film transistor. Here, a pixel electrode is formed as the conductive layer, and a light-emitting display panel is formed as the semiconductor device. Furthermore, FIG. 8A to 8D show one pixel of the light-emitting display panel, which will be described below.

Figure 8A:
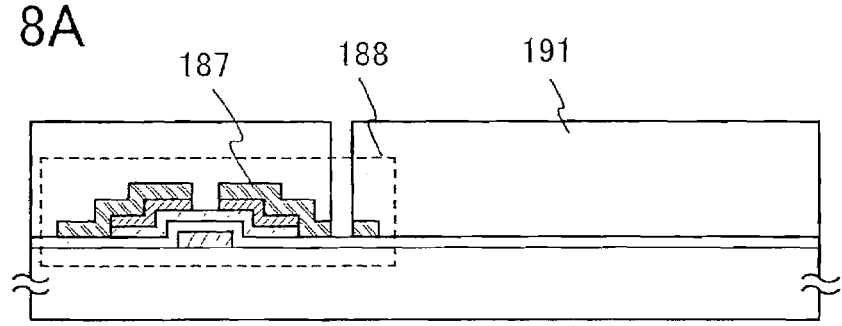
FIGS. 8A to 8D are cross-sectional views illustrating a method for manufacturing a semiconductor device of the present invention.

First, as shown in FIG. 8A, the thin film transistor 188 described in Embodiment Mode 2 and the insulating layer 191 covering the thin film transistor 188 and having an opening portion formed with the use of a femtosecond laser are formed over the substrate 100.

Figure 8B:
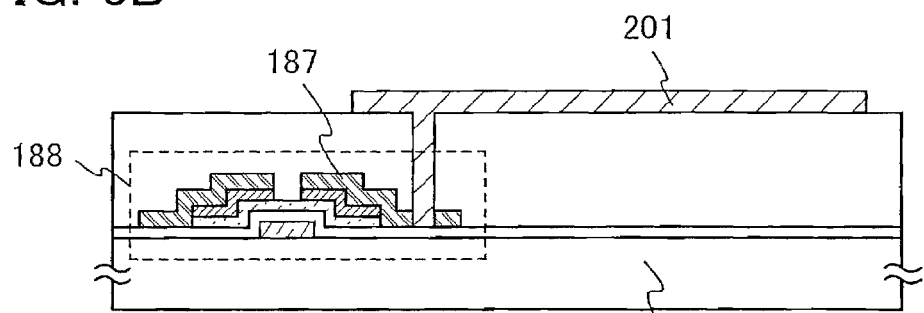

Next, as shown in FIG. 8B, a conductive layer 201 is formed to be connected to the wiring 187 similarly to Embodiment Mode 1 or 2. Note that the conductive layer 201 functions as a pixel electrode.

Figure 8C:
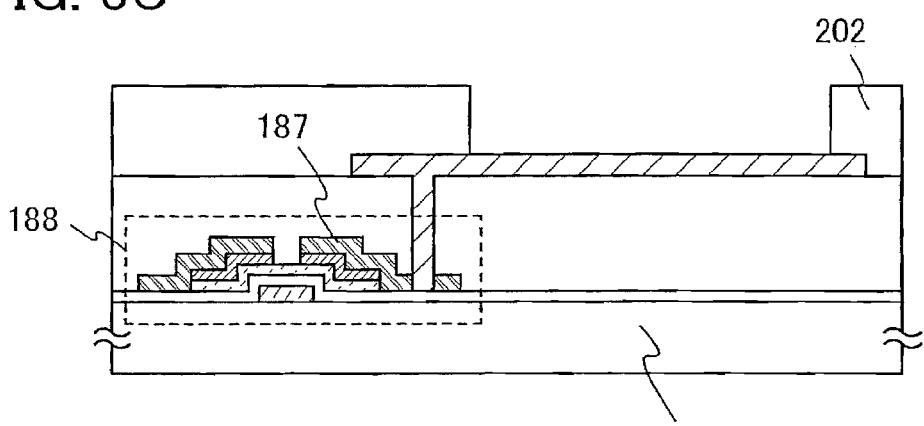
Figure 8D:
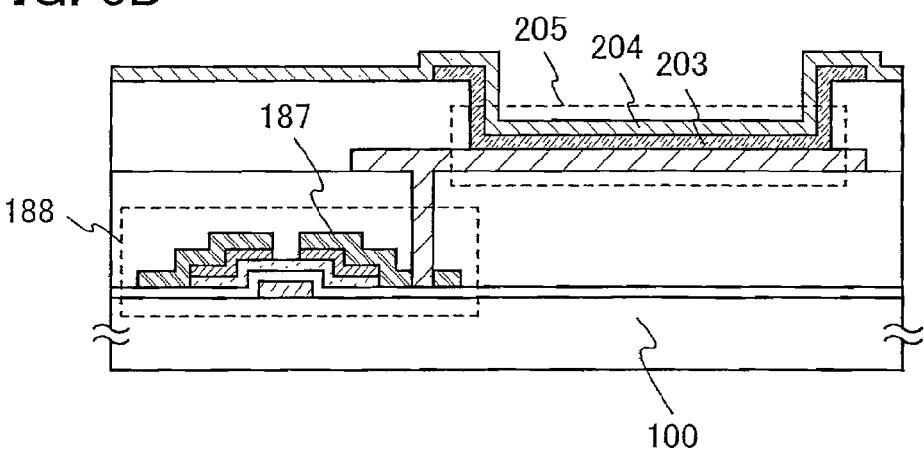

Next, as shown in FIG. 8C, an insulating layer 202 is formed to cover an end portion of the conductive layer 201 which functions as a pixel electrode. Such an insulating layer can be formed by forming an insulting layer (not shown) over the insulating layer 191 and the conductive layer 201 and removing the insulating layer over the conductive layer 201 through irradiation of the insulating layer with a femtosecond laser beam.

Next, a layer 203 including a light-emitting substance is formed over an exposed portion of the conductive layer 201 and over a part of the insulating layer 202, and a conductive layer 204 which function as a pixel electrode is formed thereover. Through the above steps, a light-emitting element 205 which includes the conductive layer 201, the layer 203 including a light-emitting substance, and the conductive layer 204 can be formed.

Here, a structure of the light-emitting element 205 is described.

When a layer using an organic compound and functioning to emit light (hereinafter referred to as a light-emitting layer 343) is formed in the layer 203 including a light-emitting substance, the light-emitting element 205 functions as an organic EL element.

Examples of a light-emitting organic compound are as follows: 9,10-di(2-naphthyl)anthracene (abbr.: DNA); 2-tert-butyl-9,10-di(2-naphthyl)anthracene (abbr.: t-BuDNA); 4,4'-bis(2,2-diphenylvinyl)biphenyl (abbr.: DPVBi); coumarin 30; coumarin 6; coumarin 545; coumarin 545T; perylene; rubrene; periflanthene; 2,5,8,11-tetra(tert-butyl)perylene (abbr.: TBP); 9,10-diphenylanthracene (abbr.: DPA); 5,12-diphenyltetracene, 4-(dicyanomethylene)-2-methyl-6-[p-(dimethylamino)styryl]-4H-pyran (abbr.: DCM1); 4-(dicyanomethylene)-2-methyl-6-[2-(julolidin-9-yl)ethenyl]-4H-pyran (abbr.: DCM2); 4-(dicyanomethylene)-2,6-bis[p-(dimethylamino)styryl]-4H-pyran (abbr.: BisDCM); and the like. Other examples are compounds that can produce phosphorescence, such as bis[2-(4',6'-difluorophenyl)pyridinato-N,$C^2$](picolinato)iridium (abbr.: FIrpic), bis{2-[3',5'-bis(trifluoromethyl)phenyl]pyridinato-N,$C^2$}(picolinato)iridium (abbr.: Ir($CF_3$ppy)$_2$(pic)), tris(2-phenylpyridinato-N,$C^2$)iridium (abbr.: Ir(ppy)$_3$), (acetylacetonato)bis(2-phenylpyridinato-N,$C^2$)iridium (abbr.: Ir(ppy)$_2$(acac)), (acetylacetonato)bis[2-(2'-thienyl)pyridinato-N,$C^3$]iridium (abbr.: Ir(thp)$_2$(acac)), (acetylacetonato)bis(2-phenylquinolinato-N,$C^2$)iridium (abbr.: Ir(pq)$_2$(acac)), and (acetylacetonato)bis[2-(2'-benzothienyl)pyridinato-N,$C^3$]iridium (abbr.: Ir(btp)$_2$(acac)).

Figure 9A:
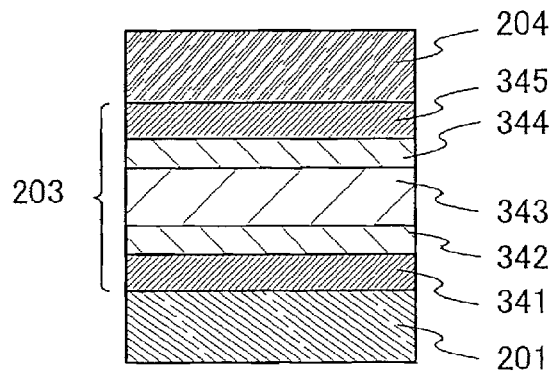
FIGS. 9A to 9E are diagrams each illustrating a cross-sectional structure of a light-emitting element which is applicable to the present invention.

As shown in FIG. 9A, the light-emitting element 205 may be formed with a first conductive layer 201, a layer 203 containing a light-emitting material, which includes a hole injection layer 341 formed of a hole injection material, a hole transport layer 342 formed of a hole transport material, a light-emitting layer 343 formed of a light-emitting organic compound, an electron transport layer 344 formed of an electron transport material, and an electron injection layer 345 formed of an electron injection material, and a second conductive layer 204.

Examples of a hole transport material are: phthalocyanine (abbr.: $H_2Pc$); copper phthalocyanine (abbr.: CuPc); vanadyl phthalocyanine (abbr.: VOPc); 4,4',4"-tris(N,N-diphenylamino)triphenylamine (abbr.: TDATA); 4,4',4"-tris[N-(3-methylphenyl)-N-phenylamino]triphenylamine (abbr.: MTDATA); 1,3,5-tris[N,N-di(m-tolyl)amino]benzene (abbr.: m-MTDAB); N,N'-diphenyl-N,N'-bis(3-methylphenyl)-1,1'-biphenyl-4,4'-diamine (abbr.: TPD); 4,4'-bis[N-(1-naphthyl)-N-phenylamino]biphenyl (abbr.: NPB); 4,4'-bis{N-[4-di(m-tolyl)amino]phenyl-N-phenylamino}biphenyl (abbr.: DNTPD); 4,4'-bis[N-(4-biphenylyl)-N-phenylamino]biphenyl (abbr.: BBPB); 4,4',4"-tri(N-carbazolyl)triphenylamine (abbr.: TCTA); and the like. However, the hole transport material is not restricted to these. Among the aforementioned compounds, aromatic amine compounds typified by TDATA, MTDATA, m-MTDAB, TPD, NTD, DNTPD, BBPB, and TCTA easily generate holes and are preferable compounds as the organic compound. The substances mentioned here mainly have a hole mobility of $10^{-6}$ $cm^2/Vs$ or higher.

As a hole injection material, a chemically-doped conductive high-molecular compound, polyethylene dioxythiophene (abbr.: PEDOT) doped with polystyrenesulfonate (abbr.: PSS), polyaniline (abbr.: PAM), or the like can be used besides the above-mentioned hole transport materials. Moreover, a thin film of an inorganic semiconductor such as molybdenum oxide, vanadium oxide, or nickel oxide or an ultrathin film of an inorganic insulator such as aluminum oxide is also effective.

Here, examples of an electron transport material are materials including metal complexes having a quinoline skeleton or a benzoquinoline skeleton, and the like, such as tris(8-quinolinolato)aluminum (abbr.: Alq$_3$), tris(4-methyl-8-quinolinolato)aluminum (abbr.: Almq$_3$), bis(10-hydroxybenzo[h]-quinolinato)beryllium (abbr.: BeBq$_2$), and bis(2-methyl-8-quinolinolato)-4-phenylphenolato-aluminum (BAlq). Other examples are materials including metal complexes having an oxazole-based ligand or a thiazole-based ligand, and the like, such as bis[2-(2-hydroxyphenyl)benzoxazolato]zinc (abbr.: Zn(BOX)$_2$) and bis[2-(2-hydroxyphenyl)benzothiazolato]zinc (abbr.: Zn(BTZ)$_2$). Besides metal complexes, other examples are as follows: 2-(4-biphenylyl)-5-(4-tert-butylphenyl)-1,3,4-oxadiazole (abbr.: PBD); 1,3-bis[5-(p-tert-butylphenyl)-1,3,4-oxadiazol-2-yl]benzene (abbr.: OXD-7); 3-(4-tert-butylphenyl)-4-phenyl)-5-(4-biphenylyl)-1,2,4-triazole (abbr.: TAZ); 3-(4-tert-butylphenyl)-4-(4-ethylphenyl)-5-(4-biphenylyl)-1,2,4-triazole (abbr.: p-EtTAZ); bathophenanthroline (abbr.: BPhen); bathocuproin (abbr.: BCP); and the like. The substances mentioned here mainly have an electron mobility of $10^{-6}$ $cm^2/Vs$ or higher.

As an electron injection material, an ultrathin film of an insulator is often used besides the aforementioned electron transport materials; for example, a halide of an alkali metal such as LiF or CsF, a halide of an alkaline earth metal such as $CaF_2$, or an oxide of an alkali metal such as $Li_2O$. In addition, an alkali metal complex such as lithium acetylacetonate (abbr.: Li(acac)) or 8-quinolinolato-lithium (abbr.: Liq) is also effective. Further, a material in which the aforementioned electron transport material and a metal having a low work function such as Mg, Li, or Cs are mixed by co-evaporation or the like can be used.

Figure 9B:
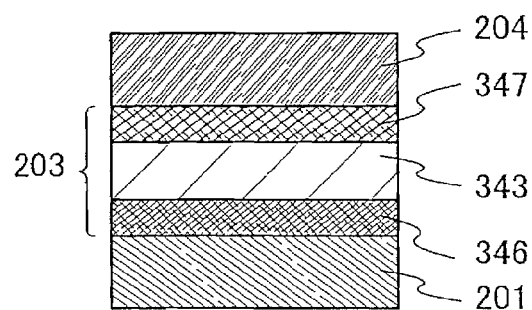

As shown in FIG. 9B, the light-emitting element 205 may be formed with a first conductive layer 201, a layer 203 containing a light-emitting material, which includes a hole transport layer 346 formed of an organic compound and an inorganic compound having an electron accepting property with respect to the organic compound, a light-emitting layer 343 formed of a light-emitting organic compound, and an electron transport layer 347 formed of an inorganic compound having an electron donating property with respect to the light-emitting organic compound, and a second conductive layer 204.

The hole transport layer 346 formed of a light-emitting organic compound and an inorganic compound having an electron accepting property with respect to the light-emitting organic compound is formed by appropriately using the aforementioned hole-transporting organic compound as the organic compound. The inorganic compound may be any inorganic compound that can easily accept electrons from the organic compound, and various metal oxides or metal nitrides can be used. In particular, an oxide of a transition metal belonging to any of Groups 4 to 12 in the periodic table of the elements is preferable because such an oxide is likely to have an electron accepting property. Specifically, titanium oxide, zirconium oxide, vanadium oxide, molybdenum oxide, tungsten oxide, rhenium oxide, ruthenium oxide, zinc oxide, or the like is given. Among the metal oxides described above, an oxide of a transition metal belonging to any of Groups 4 to 8 in the periodic table of the elements is preferable for its high electron accepting property. In particular, vanadium oxide, molybdenum oxide, tungsten oxide, and rhenium oxide are preferable because they can be formed by evaporation in vacuum and can easily be handled.

The electron transport layer 347 formed of a light-emitting organic compound and an inorganic compound having an electron donating property with respect to the light-transmitting organic compound is formed by appropriately using the aforementioned electron-transporting organic compound as the organic compound. The inorganic compound may be any inorganic compound that can easily donate electrons to the organic compound, and various metal oxides or metal nitrides can be used. In particular, an alkali metal oxide, an alkaline earth metal oxide, a rare earth metal oxide, an alkali metal nitride, an alkaline earth metal nitride, and a rare earth metal nitride are preferable because such oxides and nitrides are likely to have an electron donating property. Specifically, lithium oxide, strontium oxide, barium oxide, erbium oxide, lithium nitride, magnesium nitride, calcium nitride, yttrium nitride, lanthanum nitride, or the like is given. In particular, lithium oxide, barium oxide, lithium nitride, magnesium nitride, and calcium nitride are preferable because they can be formed by evaporation in vacuum and can easily be handled.

Since the electron transport layer 347 or the hole transport layer 346 formed of a light-emitting organic compound and an inorganic compound is superior in an electron injection/transport property, various materials can be used to form the first conductive layer 201 and the second conductive layer 204 without much restriction by the work function. Moreover, the drive voltage can be decreased.

When a layer using an organic compound and functioning to emit light (hereinafter referred to as a light-emitting layer 349) is formed in the layer 203 including a light-emitting substance, the light-emitting element 205 functions as an inorganic EL element. Inorganic EL elements are classified according to their element structures into a dispersed inorganic EL element and a thin-film inorganic EL element. They are different in that the former includes a layer including a light-emitting substance, in which particles of a light-emitting material are dispersed in a binder and the latter includes a layer including a light-emitting substance, which is formed of a thin film of a light-emitting material; however, they are common in that they require electrons accelerated by a high electric field. Note that a mechanism for obtainable light emission includes a donor-acceptor recombination light emission which utilizes a donor level and an acceptor level and a localized light emission which utilizes inner-shell electron transition of metal ions. In general, it is often the case that the dispersed inorganic EL element performs the donor-acceptor recombination light emission and the thin-film inorganic EL element performs the localized light emission. A structure of an inorganic EL element is described below.

A light-emitting material which can be used in this embodiment mode includes a base material and an impurity element serving as a light-emitting center. Light emission of various colors can be obtained by changing impurity elements to be contained. As a method for producing a light-emitting material, various methods such as a solid phase method and a liquid phase method (coprecipitation method) can be used. In addition, a liquid phase method such as a spray pyrolysis method, a double decomposition method, a method by precursor pyrolysis, a reverse micelle method, a combined method of one of these methods and high-temperature baking, or a freeze-drying method can be used.

The solid phase method is a method by which a base material and an impurity element or a compound containing an impurity element are weighed, mixed in a mortar, and reacted by heating and baking in an electric furnace to make the impurity element contained in the base material. The baking temperature is preferably in the range of 700° C. to 1500° C. This is because solid phase reaction does not proceed when the temperature is too low and the base material is decomposed when the temperature is too high. Note that the baking may be performed in powder form, but the baking is preferably performed in pellet form. The method requires baking at a relatively high temperature; however, it is a simple method. Therefore, the method provides high productivity and is suitable for mass production.

The liquid phase method (coprecipitation method) is a method by which a base material or a compound containing a base material is reacted in a solution with an impurity element or a compound containing an impurity element and the reactant is baked after being dried. Particles of the light-emitting material are uniformly distributed, a particle size is small, and the reaction proceeds even at a low baking temperature.

As the base material used for a light-emitting material of an inorganic EL element, a sulfide, an oxide, or a nitride can be used. As a sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. As an oxide, zinc oxide (ZnO), yttrium oxide ($Y_2O_3$), or the like can be used, for example. As a nitride, aluminum nitride (AlN), gallium nitride (GaN), indium nitride (InN), or the like can be used, for example. Further, zinc selenide (ZnSe), zinc telluride (ZnTe), or the like can also be used. It may be a ternary mixed crystal such as calcium gallium sulfide ($CaGa_2S_4$), strontium gallium sulfide ($SrGa_2S_4$), or barium gallium sulfide ($BaGa_2S_4$).

As the light-emitting center of localized light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added as a charge compensation.

On the other hand, as the light-emitting center of donor-acceptor recombination light emission, a light-emitting material which contains a first impurity element forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

In a case of synthesizing the light-emitting material of donor-acceptor recombination light emission by a solid phase method, a base material, a first impurity element or a compound containing a first impurity element, and a second impurity element or a compound containing a second impurity element are separately weighed, mixed in a mortar, and then heated and baked in an electric furnace. As the base material, the above-mentioned base material can be used. As the first impurity element or the compound containing the first impurity element, fluorine (F), chlorine (Cl), aluminum sulfide ($Al_2S_3$), or the like can be used, for example. As the second impurity element or the compound containing the second impurity element, copper (Cu), silver (Ag), copper sulfide ($Cu_2S$), silver sulfide ($Ag_2S$), or the like can be used, for example. The baking temperature is preferably in the range of 700° C. to 1500° C. This is because solid phase reaction does not proceed when the temperature is too low and the base material is decomposed when the temperature is too high. Note that the baking may be performed in powder form, but the baking is preferably performed in pellet form.

As the impurity element in the case of utilizing solid phase reaction, a compound including the first impurity element and the second impurity element may be used. In this case, the impurity element is easily diffused and the solid phase reaction easily proceeds, so that a uniform light-emitting material can be obtained. Furthermore, a high-purity light-emitting material can be obtained because an unnecessary impurity element is not mixed. As the compound including the first impurity element and the second impurity element, copper chloride (CuCl), silver chloride (AgCl), or the like can be used, for example.

Note that the concentration of the impurity element to the base material may be in the range of 0.01 atomic % to 10 atomic %, preferably 0.05 atomic % to 5 atomic %.

Figure 9C:
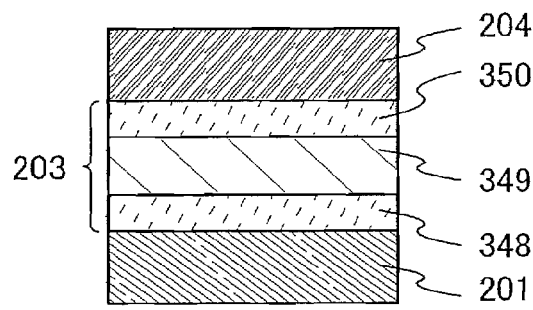

FIG. 9C shows a cross section of an inorganic EL element in which the layer 203 including a light-emitting substance includes a first insulating layer 348, a light-emitting layer 349, and a second insulating layer 350.

In the case of the thin-film inorganic EL element, the light emitting layer 349 is a layer containing the above-mentioned light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

The first insulating layer 348 and the second insulating layer 350 are not particularly limited, but they preferably have high withstand voltage and dense film quality. Furthermore, they preferably have a high dielectric constant. For example, a film of silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, a mixed film thereof, or a stacked film of two or more kinds can be used. The first insulating layer 348 and the second insulating layer 350 can be formed by sputtering, evaporation, CVD, or the like. Although the thickness is not particularly limited, it is preferably in the range of 10 nm to 1000 nm. Note that the light-emitting element of this embodiment mode does not necessarily require hot electrons; therefore, it can be formed into a thin film and has an advantage of reduction in drive voltage. The light-emitting element preferably has a thickness of 500 nm or less, more preferably, 100 nm or less.

Note that although not shown, a buffer layer may be provided between the light-emitting layer 349 and the insulating layers 348 and 350 or between the light-emitting layer 349 and the conductive layers 201 and 204. This buffer layer facilitates carrier injection and functions to suppress mixture of both layers. Although a material of the buffer layer is not particularly limited, the base material of the light-emitting layer such as ZnS, ZnSe, ZnTe, CdS, SrS, or BaS; CuS or $Cu_2S$; or alkali halide such as LiF, $CaF_2$, $BaF_2$, or $Mg_2$ can be used.

Figure 9D:
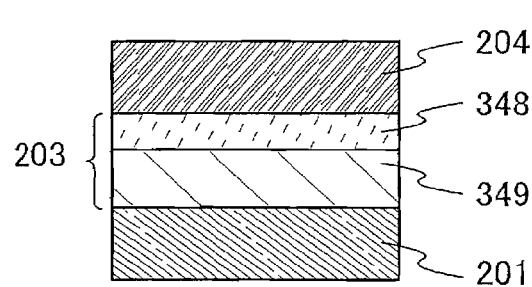

Furthermore, as shown in FIG. 9D, the layer 203 including a light-emitting substance may include the light-emitting layer 349 and the first insulating layer 348. In this case, FIG. 9D shows a mode in which the first insulating layer 348 is provided between the second conductive layer 204 and the light-emitting layer 349. Note that the first insulating layer 348 may be provided between the first conductive layer 201 and the light-emitting layer 349.

Moreover, the layer 203 including a light-emitting substance may include only the light-emitting layer 349. That is, the light-emitting element 205 may be formed with the first conductive layer 201, the layer 203 including a light-emitting substance, and the second conductive layer 204.

In the case of the dispersed inorganic EL element, a particulate light-emitting material is dispersed in a binder to form a film-like layer including a light-emitting substance. In a case where particles each having a desired size cannot be sufficiently obtained by a production method of a light-emitting material, the material may be processed into particles by crushing in a mortar or the like. The binder is a substance for fixing a particulate light-emitting material in a dispersed manner and holding the material in shape as the layer including a light-emitting substance. The light-emitting material is uniformly dispersed and fixed in the layer including a light-emitting substance by the binder.

In the case of the dispersed inorganic EL element, the layer including a light-emitting substance can be formed by a droplet discharge method which can selectively form the layer including a light-emitting substance, a printing method (such as screen printing or off-set printing), a coating method such as a spin-coating method, a dipping method, a dispenser method, or the like. The thickness is not particularly limited, but it is preferably in the range of 10 nm to 1000 nm. In addition, in the layer including a light-emitting substance, which contains the light-emitting material and the binder, the proportion of the light-emitting material is preferably in the range of 50 wt % to 80 wt %.

Figure 9E:
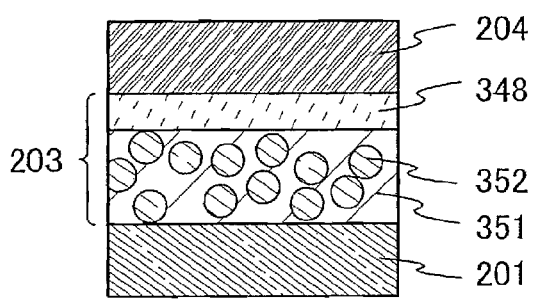

An element in FIG. 9E includes the first conductive layer 201, the layer 203 including a light-emitting substance, and the second conductive layer 204, and the layer 203 including a light-emitting substance is formed with a light-emitting layer in which a light-emitting material 352 is dispersed in a binder, and an insulating layer 348. Note that in the structure shown in FIG. 9E, the insulating layer 348 is in contact with the second conductive layer 204. However, it may be in contact with the first conductive layer 201. Alternatively, the element may include respective insulating layers in contact with the first conductive layer 201 and the second conductive layer 204. Still alternatively, it is acceptable that the element does not include an insulating layer in contact with the first conductive layer 201 or the second conductive layer 204.

As the binder which can be used in this embodiment mode, an organic material, an inorganic material, or a mixed material of an organic material and an inorganic material can be used. As an organic material, a polymer having a relatively high dielectric constant, such as a cyanoethyl cellulose resin, or a resin such as polyethylene, polypropylene, a polystyrene resin, a silicone resin, an epoxy resin, or vinylidene fluoride can be used. Alternatively, a heat resistant high-molecular compound such as aromatic polyamide or polybenzimidazole, or a siloxane resin may be used. Note that the siloxane resin corresponds to a resin including a Si—O—Si bond. Siloxane includes a skeleton formed from a bond of silicon (Si) and oxygen (O). An organic group containing at least hydrogen (for example, an alkyl group or aromatic hydrocarbon) or a fluoro group may be used for a substituent, or an organic group containing at least hydrogen and a fluoro group may be used for substituents. Alternatively, a resin material such as a vinyl resin like polyvinyl alcohol or polyvinylbutyral, a phenol resin, a novolac resin, an acrylic resin, a melamine resin, a urethane resin, or an oxazole resin (polybenzoxazole) may be used. A photocurable resin or the like can also be used. A dielectric constant can be adjusted by appropriately mixing high dielectric constant fine particles of barium titanate ($BaTiO_3$), strontium titanate ($SrTiO_3$), or the like in the above resin.

As an inorganic material included in the binder, a material selected from substances containing inorganic materials can be used, such as silicon oxide ($SiO_X$), silicon nitride ($SiN_X$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), or ZnS. A dielectric constant of the layer including a light-emitting substance, which includes the light-emitting material and the binder, can be controlled by making an organic material contain a high dielectric constant inorganic material (by addition or the like), so that a dielectric constant can be increased.

In a producing process, a light-emitting material is dispersed in a solution including a binder. As a solvent of the solution including the binder that can be used in this embodiment mode, a solvent in which a binder material is soluble and which can produce a solution having a viscosity suitable for a method for forming the light-emitting layer (various wet processes) and a desired thickness, may be selected appropriately. An organic solvent or the like can be used. In the case of using, for example, a siloxane resin as the binder, propylene glycol monomethyl ether, propylene glycol monomethyl ether acetate (also referred to as PGMEA), 3-methoxy-3-methyl-1-butanol (also referred to as MMB), or the like can be used.

The inorganic EL light-emitting element, which can provide light emission by voltage application between a pair of electrodes sandwiching the layer including a light-emitting substance, can be operated by either DC drive or AC drive.

Here, as for a light-emitting element expressing a red color, an ITO layer containing silicon oxide with a thickness of 125 nm is formed as the second conductive layer which functions as a first pixel electrode. As the light-emitting layer, a DNTPD layer with a thickness of 50 nm, a NPB layer with a thickness of 10 nm, a layer of NPB doped with bis[2,3-bis(4-fluorophenyl)quinoquixalinato]iridium(acetylacetonate) (abbr.: $Ir(Fdpq)_2(acac)$) with a thickness of 30 nm, an $Alq_3$ layer with a thickness of 30 nm, and a LiF layer with a thickness of 1 nm are stacked. As a third conductive layer which functions as a second pixel electrode, an Al layer with a thickness of 200 nm is formed.

As for a light-emitting element expressing a green color, an ITO layer containing silicon oxide with a thickness of 125 nm is formed as the second conductive layer which functions as the first pixel electrode. As the light-emitting layer, a DNTPD layer with a thickness of 50 nm, a NPB layer with a thickness of 10 nm, a layer of $Alq_3$ doped with coumarin 545T (C545T) with a thickness of 40 nm, an $Alq_3$ layer with a thickness of 30 nm, and a LiF layer with a thickness of 1 nm are stacked. As the third conductive layer which functions as the second pixel electrode, an Al layer with a thickness of 200 nm is fainted.

Further, as for a light-emitting element expressing a blue color, an ITO layer containing silicon oxide with a thickness of 125 nm is formed as the second conductive layer which functions as the first pixel electrode. As the light-emitting layer, a DNTPD layer with a thickness of 50 nm, an NPB layer with a thickness of 10 nm, a layer of 9-[4-(N-carbazolyl)] phenyl-10-phenylanthracene (abbr.: CzPA) doped with 2,5,8, 11-tetra(tert-butyl)perylene (abbr.: TBP) with a thickness of 30 nm, an $Alq_3$ layer with a thickness of 30 nm, and a LiF layer with a thickness of 1 nm are stacked. As the third conductive layer which functions as the second pixel electrode, an Al layer with a thickness of 200 nm is formed.

Next, a protective film is preferably formed over the conductive layer 204.

Then, a wiring board, typically an FPC (Flexible Printed Circuit) is attached to a connection terminal portion of scan lines or signal lines with a connection conductive layer interposed therebetween. Through the above steps, a light-emitting display panel can be formed.

Note that a protective circuit for prevention of electrostatic discharge damage, typically a diode or the like, may be provided between a connection terminal and a source wiring (gate wiring) or in the pixel portion.

Figure 10A:
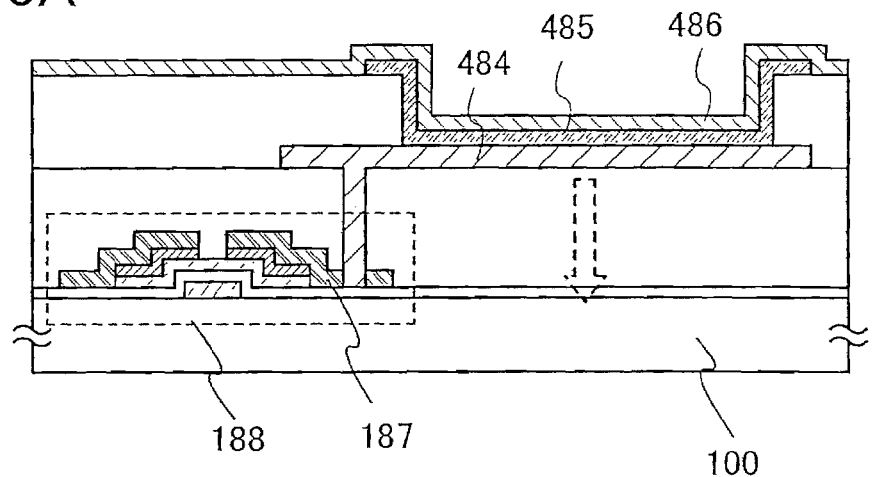
FIGS. 10A to 10C are cross-sectional views illustrating a method for manufacturing a semiconductor device of the present invention.

Here, a case where light is emitted to the substrate 100 side, that is, a case of bottom emission in the light-emitting display panel that includes the light-emitting element shown in FIG. 9A or 9B will be described with reference to FIG. 10A. In this case, a light-transmitting conductive layer 484 is in contact with the wiring 187 which functions as a source electrode layer or a drain electrode layer so as to be electrically connected to the thin film transistor 188. The light-transmitting conductive layer 484, a layer 485 including a light-emitting substance, and a light-blocking or reflecting conductive layer 486 are stacked sequentially. The substrate 100 through which light is to be transmitted needs to have a light-transmitting property with respect to at least visible light.

Figure 10B:
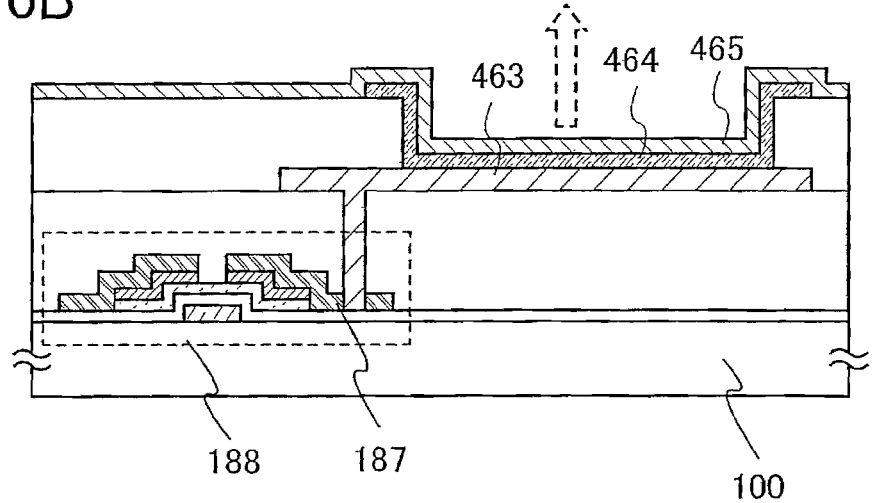

Next, a case where light is emitted to the side opposite to the substrate 100, that is, a case of top emission will be described with reference to FIG. 10B. The thin film transistor 188 can be formed similarly to the above thin film transistor. The wiring 187 which functions as a source electrode or a drain electrode and which is electrically connected to the thin film transistor 188 is in contact with and electrically connected to a light-blocking or reflecting conductive layer 463. The light-blocking or reflecting conductive layer 463, a layer 464 including a light-emitting substance, and a light-transmitting conductive layer 465 are stacked sequentially. The conductive layer 463 is a light-blocking or reflecting metal layer and reflects light which is emitted from the light-emitting element, upward as indicated by an arrow. Note that a light-transmitting conductive layer may be formed over the light-blocking or reflecting conductive layer 463. Since light from the light-emitting element is emitted through the light-transmitting conductive layer 465, the light-transmitting conductive layer 465 comprises a material which has a light-transmitting property with respect to at least visible light.

Figure 10C:
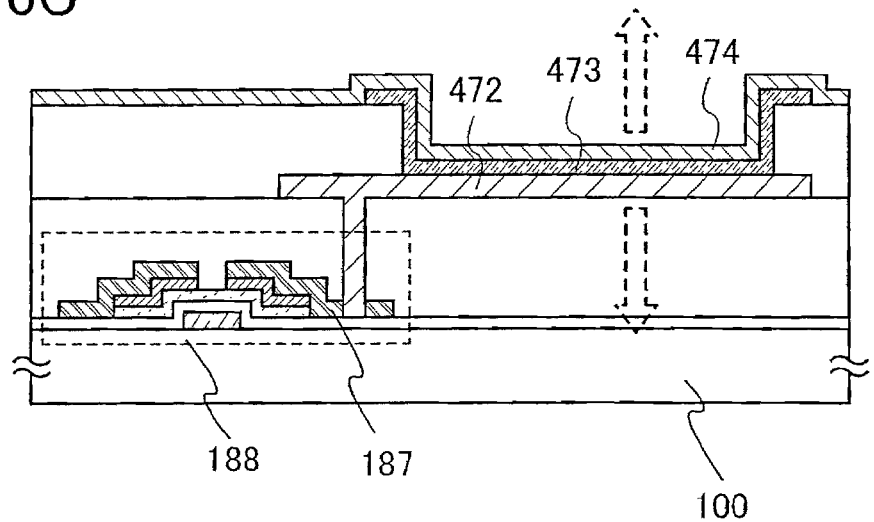

Next, a case where light is emitted to both the substrate 100 side and the side opposite to the substrate 100, that is, a case of dual emission will be described with reference to FIG. 10C. The wiring 187 which functions as a source electrode or a drain electrode and which is electrically connected to a semiconductor layer of the thin film transistor 188 is electrically connected to a first light-transmitting conductive layer 472. The first light-transmitting conductive layer 472, a layer 473 including a light-emitting substance, and a second light-transmitting conductive layer 474 are stacked sequentially. In that case, if the first light-transmitting conductive layer 472 and the second light-transmitting conductive layer 474 are both formed using a material which has a light-transmitting property with respect to at least visible light or are both formed to have thicknesses that can transmit light, dual emission is realized. In this case, an insulating layer and the substrate 100 through which light is to be transmitted also needs to have a light-transmitting property with respect to at least visible light.

Here, pixel circuits and their operation structures of light-emitting display panels including the light-emitting elements shown in FIGS. 9A and 9B will be described with reference to FIGS. 11A to 11C. The operation structures of the light-emitting display panel in a display device where a video signal is digital are classified into that in which a video signal inputted to a pixel is defined by voltage and that in which the video signal is defined by current. That in which the video signal is defined by voltage includes one in which a voltage applied to the light-emitting element is constant (CVCV) and one in which a current applied to the light-emitting element is constant (CVCC). That in which the video signal is defined by current includes one in which a voltage applied to the light-emitting element is constant (CCCV) and one in which a current applied to the light-emitting element is constant (CCCC). In this embodiment mode, a pixel which performs CVCV operation is described with reference to FIGS. 11A and 11B. In addition, a pixel which performs CVCC operation is described with reference to FIG. 11C.

Figure 11A:
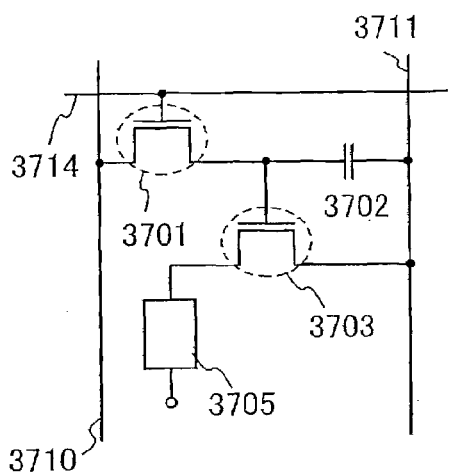
FIGS. 11A to 11C are diagrams each illustrating an equivalent circuit of a light-emitting element which is applicable to the present invention.
Figure 11B:
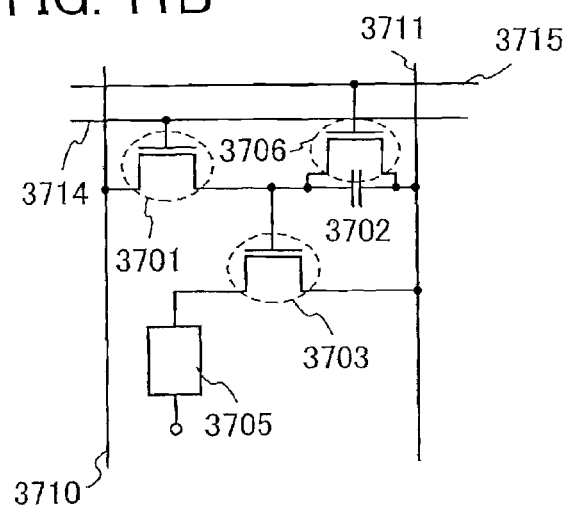
Figure 11C:
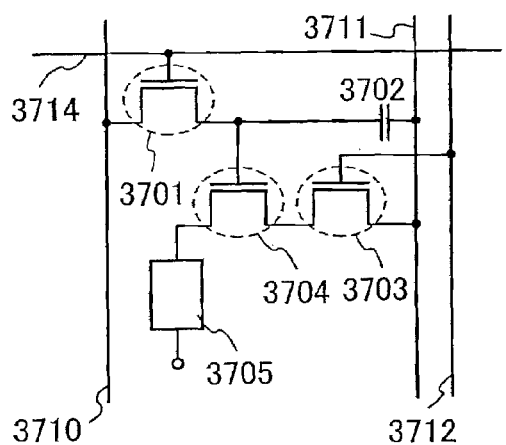

In each of pixels shown in FIGS. 11A and 11B, a signal line 3710 and a power supply line 3711 are arranged in a column direction, and a scan line 3714 is arranged in a row direction. Further, the pixel includes a switching TFT 3701, a driving TFT 3703, a capacitor 3702, and a light-emitting element 3705.

Note that the switching TFT 3701 and the driving TFT 3703, when turned on, operate in a linear region. The driving TFT 3703 functions to control voltage application to the light-emitting element 3705. It is preferable from the viewpoint of manufacturing steps that both of the TFTs have the same conductivity type. The driving TFT 3703 may be not only an enhancement mode TFT but also a depletion mode TFT. In addition, a ratio of a channel width W to a channel length L (W/L) of the driving TFT 3703 preferably ranges from 1 to 1000, although it depends on the mobility of the TFT. The higher the W/L is, the more electrical characteristics of the TFT are improved.

In each of the pixels shown in FIGS. 11A and 11B, the switching TFT 3701 controls a video signal input to the pixel. When the switching TFT 3701 is turned on, the video signal is inputted to the pixel. Then, voltage of the video signal is stored in the capacitor 3702.

In FIG. 11A, an opposite electrode of the light-emitting element 3705 is an anode and an electrode connected to the driving TFT 3703 is a cathode in the case where the power supply line 3711 is at Vss and the opposite electrode of the light-emitting element 3705 is at Vdd. In this case, luminance variations due to variations in characteristics of the driving TFT 3703 can be suppressed.

In FIG. 11A, the opposite electrode of the light-emitting element 3705 is a cathode and the electrode connected to the driving TFT 3703 is an anode in the case where the power supply line 3711 is at Vdd and the opposite electrode of the light-emitting element 3705 is at Vss. In this case, a voltage of the video signal is stored in the capacitor 3702 and the driving TFT 3703 operates in a linear region by inputting the video signal having a higher voltage than Vdd to the signal line 3710. Therefore, luminance variations due to variations in characteristics of the TFT can be suppressed.

The pixel shown in FIG. 11B has a similar structure to that of the pixel shown in FIG. 11A except that a TFT 3706 and a scan line 3715 are added.

In the TFT 3706, ON or OFF is controlled by the scan line 3715 that is additionally provided. When the TFT 3706 is turned ON, an electric charge held in the capacitor 3702 is discharged, and the TFT 3703 is turned OFF. In other words, it is possible to make a state in which current is forced not to flow through the light-emitting element 3705 by disposing the TFT 3706. Therefore, the TFT 3706 can be referred to as an erasing TFT. Accordingly, in the structure of FIG. 11B, a lighting period can be started simultaneously with or immediately after a start of a writing period without waiting for writing of signals in all pixels. Consequently, a duty ratio of light emission can be improved.

In the pixel having the above operation structure, the amount of electric current of the light-emitting element 3705 can be determined by the driving TFT 3703 which operates in a linear region. According to the above-described structure, variation in characteristics of the TFT can be improved, and luminance variation of the light-emitting element, which is caused by variation in characteristics of the TFT, can be improved, and a display device with improved image quality can be provided.

Next, a pixel which performs CVCC operation is described with reference to FIG. 11C. The pixel shown in FIG. 11C is provided with a power supply line 3712 and a current control TFT 3704 in addition to the pixel structure shown in FIG. 11A. Note that in the pixel shown in FIG. 11C, a gate electrode of the current control TFT 3704 is connected to the power supply line 3712.

Note that the switching TFT 3701 operates in a linear region and the driving TFT 3703 operates in a saturation region. In addition, the driving TFT 3703 has a role of controlling the amount of electric current flowing through the light-emitting element 3705, and the current control TFT 3704 operates in a saturation region and has a role of controlling supply of electric current to the light-emitting element 3705.

Note that the pixels shown in FIGS. 11A and 11B can also perform CVCC operation. In the pixel having the operation structure shown in FIG. 11C, Vdd and Vss can be appropriately changed as in the pixels shown in FIGS. 11A and 11B, in accordance with a current flowing direction through the light-emitting element.

In the pixel having the above structure, the current control TFT 3704 operates in a linear region, so that slight variation in Vgs (gate-source voltage) of the current control TFT 3704 does not affect the value of electric current of the light-emitting element 3705. In other words, the value of electric current of the light-emitting element 3705 can be determined by the driving TFT 3703 which operates in a saturation region. According to the above structure, luminance variation of the light-emitting element, which is caused by variation in characteristics of the TFT, can be improved, and a display device with improved image quality can be provided.

It is preferable to form a semiconductor film of a driving TFT to be large particularly in the case of forming a thin film transistor including an amorphous semiconductor or the like, because variation of the TFT can be reduced. Since the pixels shown in FIGS. 11A and 11B each have a small number of TFTs, an aperture ratio can be increased.

The structure in which the capacitor 3702 is provided is shown; however, the present invention is not limited thereto. When a gate capacitor or the like can be used as the capacitor that can hold a video signal, the capacitor 3702 does not necessarily need to be provided.

When the semiconductor layer of the thin film transistor is formed of an amorphous semiconductor film, a threshold value tends to be shifted. Therefore, a circuit which compensates the threshold value is preferably provided in the pixel or in the periphery of the pixel.

Such an active-matrix light-emitting device is considered to be advantageous for low-voltage driving when a pixel density is increased because each pixel is provided with a TFT. On the other hand, a passive-matrix light-emitting device can be formed. In the passive-matrix light-emitting device, a TFT is not provided for each pixel; therefore, a high aperture ratio can be obtained.

In the display of the present invention, a driving method for screen display is not particularly limited. For example, a dot-sequential driving method, a line-sequential driving method, a plane-sequential driving method, or the like may be employed as the driving method. Typically, the line-sequential driving method is employed, and a time gray scale driving method or an area gray scale driving method may be appropriately used. In addition, a video signal inputted to a source line of the display device may be an analog signal or a digital signal. A driving circuit or the like may be appropriately designed in accordance with the video signal.

As described above, various pixel circuits can be used.

By using the method for manufacturing a light-emitting display panel described in this embodiment mode, an opening (contact hole) between wirings can be formed without using a complicated photolithography step, and favorable electrical contact of wirings can be obtained. Accordingly, a high-performance and high-reliability liquid crystal display panel can be manufactured with less material loss and with high yield.

Embodiment Mode 5

This embodiment mode describes an electrophoretic element as a typical example of a semiconductor device, with reference to FIG. 12 and FIGS. 13A to 13D. The electrophoretic element is an element that performs display, in which a microcapsule encapsulating positively-charged and negatively-charged black and white particles is located between a first conductive layer and a second conductive layer, and a potential difference is generated between the first conductive layer and the second conductive layer, thereby moving the black and white particles between the conductive layers.

Figure 12:
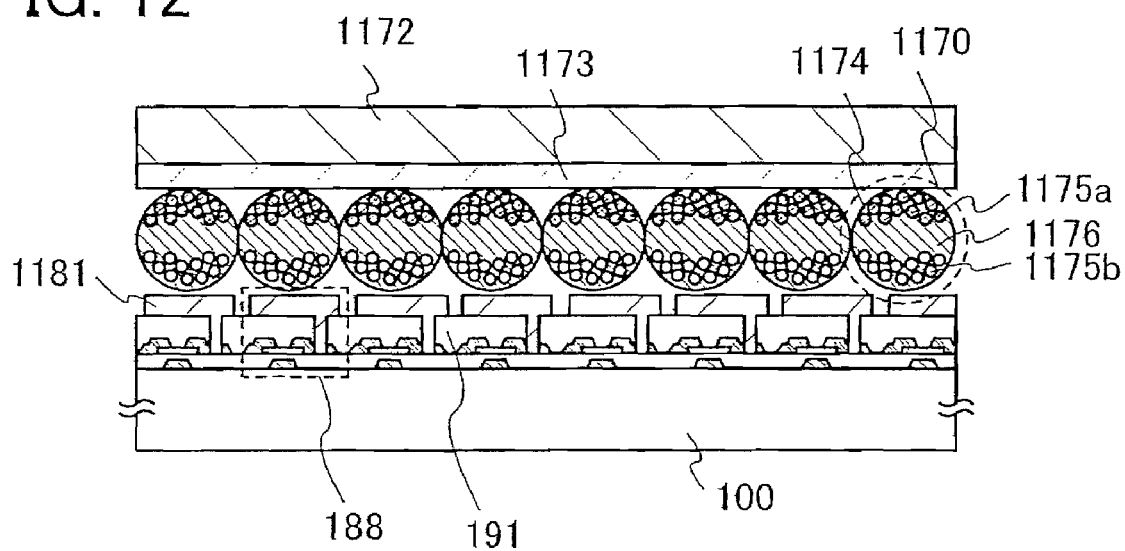
FIG. 12 is a cross-sectional view illustrating a method for manufacturing a semiconductor device of the present invention.

As shown in FIG. 12, the thin film transistors 188 described in Embodiment Mode 2 and the insulating layer 191 covering the thin film transistors 181 and having opening portions formed with the use of a femtosecond laser are formed over the substrate 100.

Next, first conductive layers 1181 are formed to be connected to the wirings 187. Note that the first conductive layers 1181 functions as pixel electrodes. Here, the first conductive layers 1181 are selectively formed using aluminum by a droplet discharge method.

Second conductive layers 1173 are formed over a substrate 1172. The second conductive layers 1173 are preferably formed to be parallel to each other similarly to the first conductive layers 1173. Here, the second conductive layers 1173 are formed using zinc oxide.

Next, the substrate 100 and the substrate 1172 are attached to each other with a sealant. At this time, microcapsules 1170 are scattered between the first conductive layer 1181 and the second conductive layer 1173, and thus, electrophoresis elements are formed between the substrate 100 and the substrate 1172. The substrate 100 and the substrate 1172 are attached to each other with a sealant so that the first conductive layers 1181 and the second conductive layers 1173 intersect. Each electrophoretic element includes the first conductive layer 1181, the microcapsule 1170, and the second conductive layer 1173. In addition, the microcapsule 1170 is fixed between the first conductive layer 1181 and the second conductive layer 1173 by a binder.

Figure 13A:
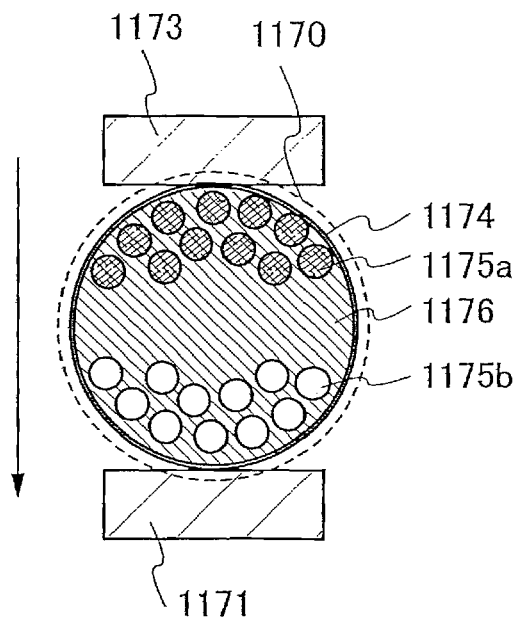
FIGS. 13A to 13D are diagrams each illustrating a cross-sectional structure of an electrophoretic element which is applicable to the present invention.
Figure 13B:
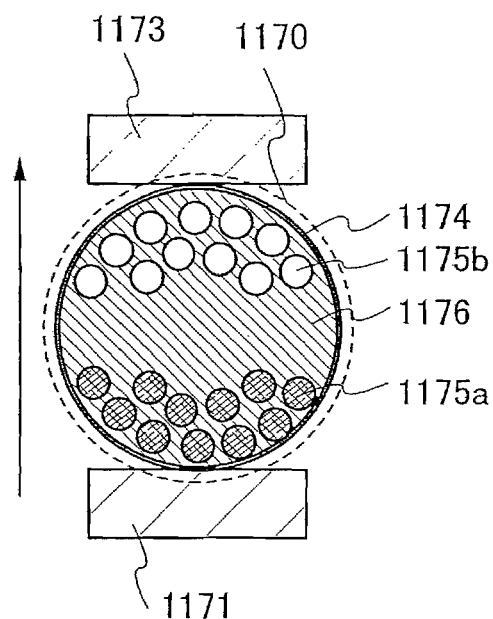
Figure 13C:
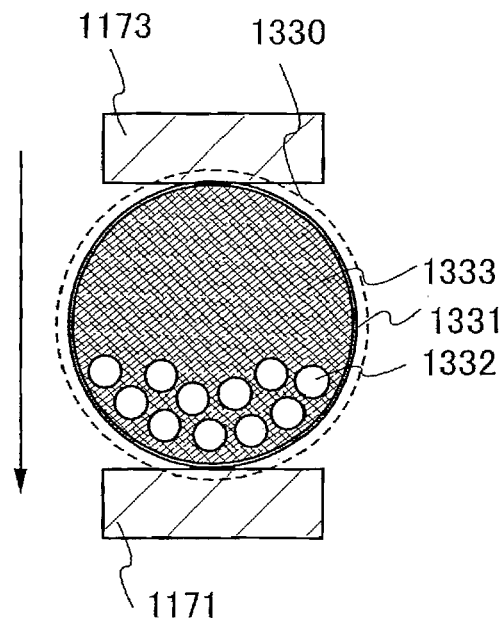
Figure 13D:
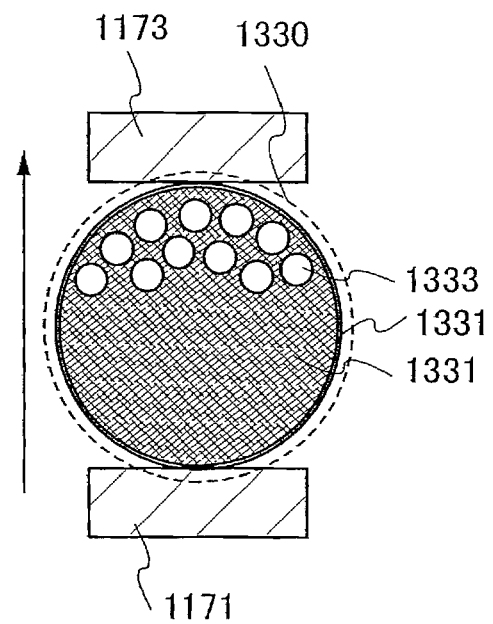

Next, the structure of the microcapsule is described with reference to FIGS. 13A to 13D. As shown in FIGS. 13A and 13B, in the microcapsule 1170, a transparent dispersion medium 1176, charged black particles 1175a, and charged white particles 1175b are dispersed in a fine transparent container 1174. Note that blue particles, red particles, green particles, yellow particles, blue-green particles, or purplish red particles may be used instead of the black particles 1175a. Further, as shown in FIGS. 13C and 13D, a microcapsule 1330 in which colored dispersion medium 1333 and white particles 1332 are dispersed in a fine transparent container 1331 may be used. Note that the colored dispersion medium 1333 may be colored in any of black, blue, red, green, yellow, blue green, and purplish red. In addition, when a microcapsule in which blue particles are dispersed, a microcapsule in which red particles are dispersed, and a microcapsule in which green particles are dispersed are each provided in one pixel, color display can be performed. Color display can also be performed when a microcapsule in which yellow particles are dispersed, a microcapsule in which blue green particles are dispersed, and a microcapsule in which purplish red particles are dispersed are each provided in one pixel. Further, color display can be performed when a microcapsule in which white particles or black particles are dispersed in a blue dispersion medium, a microcapsule in which white particles or black particles are dispersed in a red dispersion medium, and a microcapsule in which white particles or black particles are dispersed in a green dispersion medium are arranged in one pixel, or when a microcapsule in which white particles or black particles are dispersed in a yellow dispersion medium, a microcapsule in which white particles or black particles are dispersed in a blue-green dispersion medium, and a microcapsule in which white particles or black particles are dispersed in a purplish-red dispersion medium are arranged in one pixel.

Next, a display method using an electrophoresis element will be described. Specifically, a display method of the microcapsule 1170 including two colors of particles is described with reference to FIGS. 13A and 13B. Here, white particles and black particles are used as the two colors of particles, and a microcapsule including a transparent dispersion medium is described. Note that particles having another color may be used instead of the black particles of the two colors of particles.

In the microcapsule 1170, when the black particles 1175a are charged positively and the white particles 1175b are charged negatively, an electric field is applied to the first conductive layer 1171 and the second conductive layer 1173. As shown in FIG. 13A, when an electric field is applied in a direction from the second conductive layer to the first conductive layer here, the black particles 1175a migrate to the second conductive layer 1173 side, and the white particles 1175b migrate to the first conductive layer 1181 side. Accordingly, when the microcapsule is seen from the first conductive layer 1181 side, white color is observed, and when the microcapsule is seen from the second conductive layer 1173 side, black color is observed.

On the other hand, when an electric field is applied in a direction from the first conductive layer 1171 to the second conductive layer 1173 as shown in FIG. 13B, the black particles 1175a migrate to the first conductive layer 1181 side and the white particles 1175b migrate to the second conductive layer 1173 side. Accordingly, when the microcapsule is seen from the first conductive layer 1171 side, black color is observed, and when the microcapsule is seen from the second conductive layer 1173 side, white color is observed.

Next, a display method of the microcapsule 1330 including the white particles and the colored dispersion medium is described. Although an example in which the dispersion medium is colored in black is given here, a dispersion medium colored in another color can be similarly used.

In the microcapsule 1330, when the white particles 1332 are charged negatively, an electric field is applied to the first conductive layer 1171 and the second conductive layer 1173. As shown in FIG. 13C, when an electric field is applied in a direction from the second conductive layer to the first conductive layer here, the white particles 1332 migrate to the first conductive layer 1171 side. Accordingly, when the microcapsule is seen from the first conductive layer 1171 side, white color is observed, and when the microcapsule is seen from the second conductive layer 1173 side, black color is observed.

On the other hand, as shown in FIG. 13D, when an electric field is applied in a direction from the first conductive layer to the second conductive layer, the white particles 1332 migrate to the second conductive layer 1173 side. Accordingly, when the microcapsule is seen from the first conductive layer 1171 side, black is observed, and when the microcapsule is seen from the second conductive layer 1173 side, white is observed.

Although the electrophoretic element is used for description here, a display device using a twist ball display method may be used instead of the electrophoretic element. A twist ball display method refers to a method for performing display, in which a spherical particle which is white on one hemispherical surface and black on the other hemispherical surface is arranged between the first conductive layer and the second conductive layer, and a potential difference is generated between the first conductive layer and the second conductive layer to control the direction of the spherical particle.

As a switching element, MIM (Metal-Insulator-Metal), a diode, and the like can be used instead of a thin film transistor.

A display device including an electrophoretic element and a display device using a twist ball display method keep a state similar to that when voltage is applied, for a long term even after a field-effect transistor is removed. Therefore, a display state can be held even after the power is turned off. Accordingly, low power consumption is possible.

Through the above steps, a semiconductor device which includes an electrophoretic element can be manufactured.

By using the method for manufacturing a semiconductor device including an electrophoretic element, which is described in this embodiment mode, an opening (contact hole) between wirings can be formed without using a complicated photolithography step, and favorable electrical contact of wirings can be obtained. Accordingly, a high-performance and high-reliability semiconductor device including an electrophoretic element can be manufactured with less material loss and with high yield.

Embodiment Mode 6

This embodiment mode describes an example of forming a semiconductor layer of an amorphous semiconductor or a SAS and forming a scan line side driver circuit over a substrate in the display panels (the EL display panel, the liquid-crystal display panel, and the electrophoretic display panel) manufactured according to Embodiment Modes 3 to 5.

Figure 14:
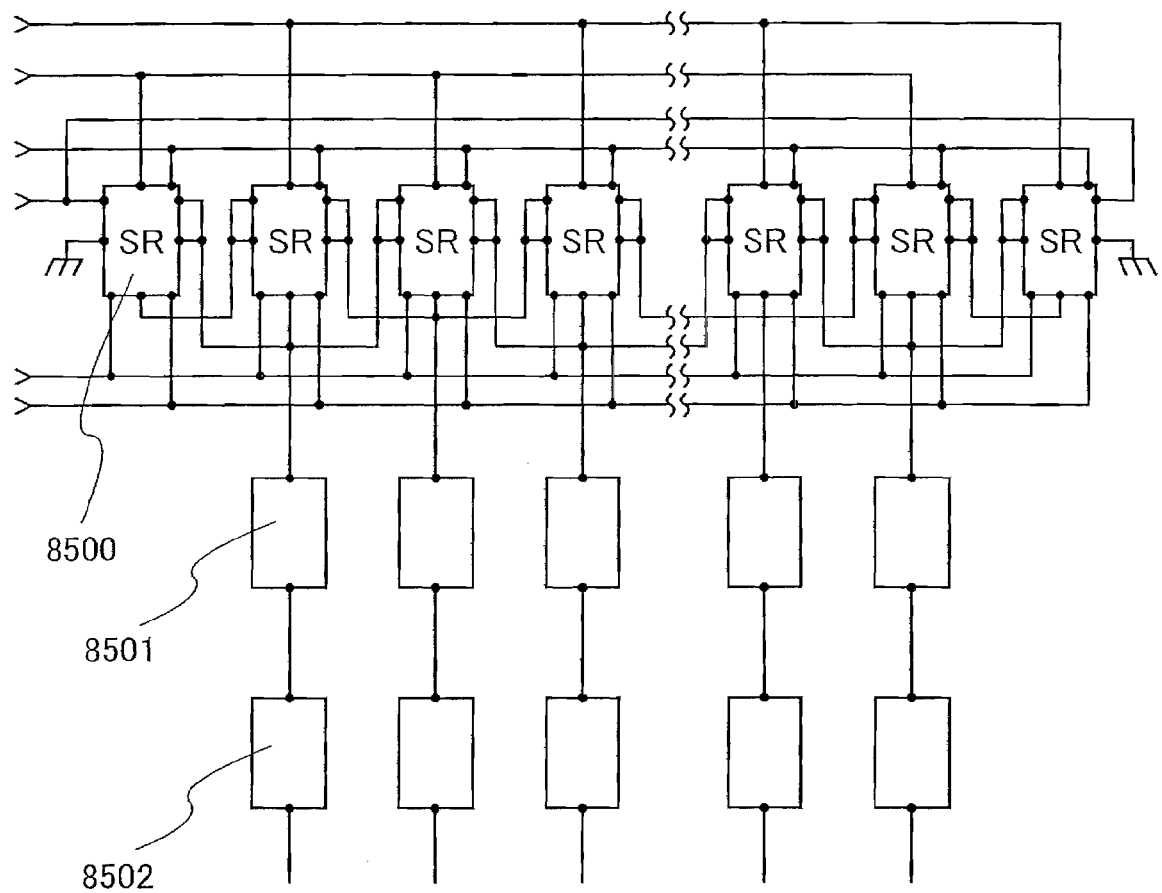
FIG. 14 is a diagram illustrating a circuit structure when a scan line side driver circuit comprises a TFT in a display panel of the present invention.

FIG. 14 shows a block diagram of a scan line side driver circuit which includes n-channel TFTs using a SAS that provides a field-effect mobility of 1 cm$^2$/V-sec to 15 cm$^2$/V-sec.

In FIG. 14, a block denoted by 8500 corresponds to a pulse output circuit which outputs sampling pulses for one stage, and a shift register includes n pulse output circuits. Reference numeral 8501 denotes a buffer circuit, which is connected to a pixel 8502.

Figure 15:
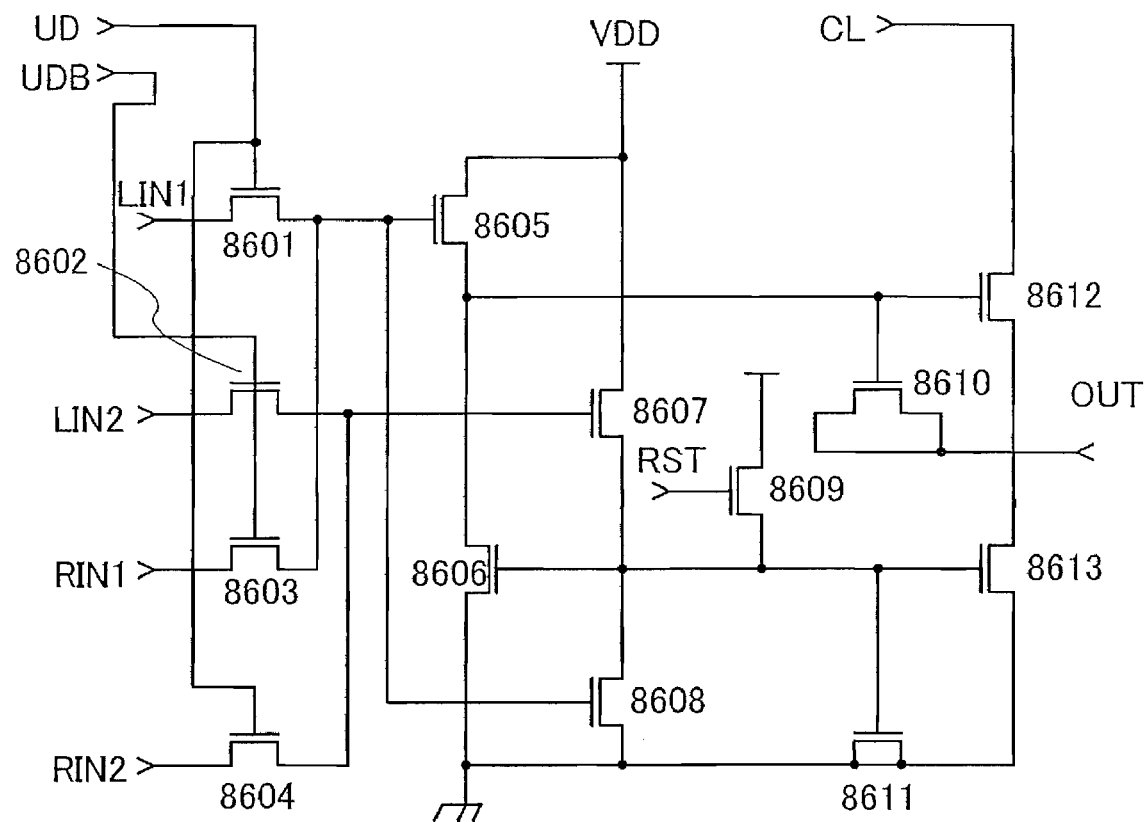
FIG. 15 is a diagram illustrating a circuit structure when a scan line side driver circuit comprises a TFT in a display panel of the present invention (shift register circuit).

FIG. 15 shows a specific structure of the pulse output circuit 8500, which includes n-channel TFTs 8601 to 8613. In that case, the size of TFT may be determined in consideration of operating characteristics of an n-channel TFT using a SAS. For example, when the channel length is 8 μm, the channel width can be set within the range of 10 μm to 80 μm.

Figure 16:
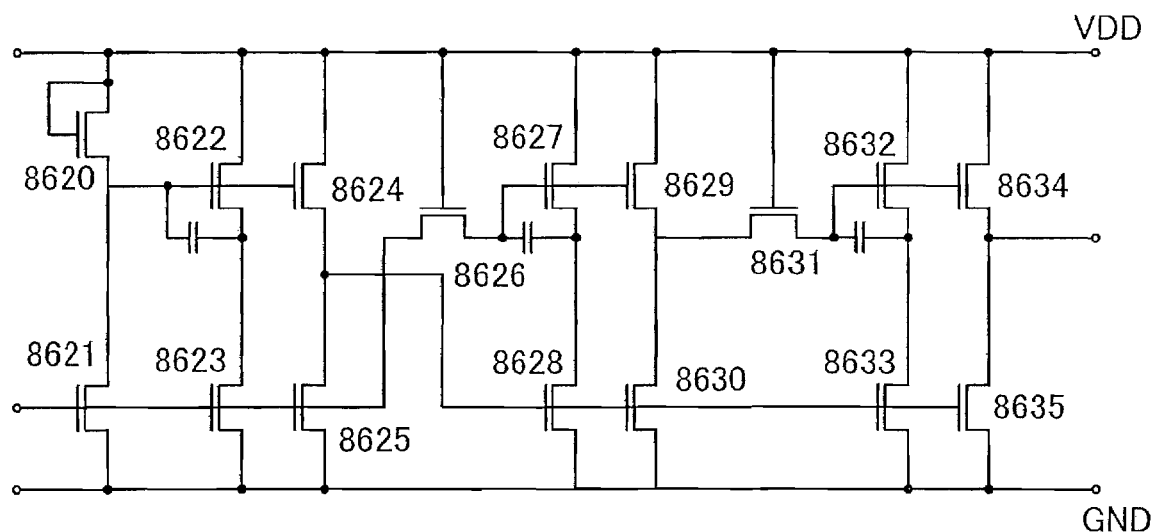
FIG. 16 is a diagram illustrating a circuit structure when a scan line side driver circuit comprises a TFT in a display panel of the present invention (buffer circuit).

FIG. 16 shows a specific structure of the buffer circuit 8501. The buffer circuit similarly includes n-channel TFTs 8620 to 8635. In that case, the size of TFT may be determined in consideration of operating characteristics of an n-channel TFT using a SAS. For example, if the channel length is 10 μm, the channel width can be set within the range of 10 μm to 1800 μm.

Realization of such a circuit requires mutual connection of TFTs by a wiring.

As described above, a driver circuit can be incorporated in a display panel.

Next, mounting of the driver circuit on the display panels described in the above embodiment modes is described with reference to FIGS. 17A to 17C.

Figure 17A:
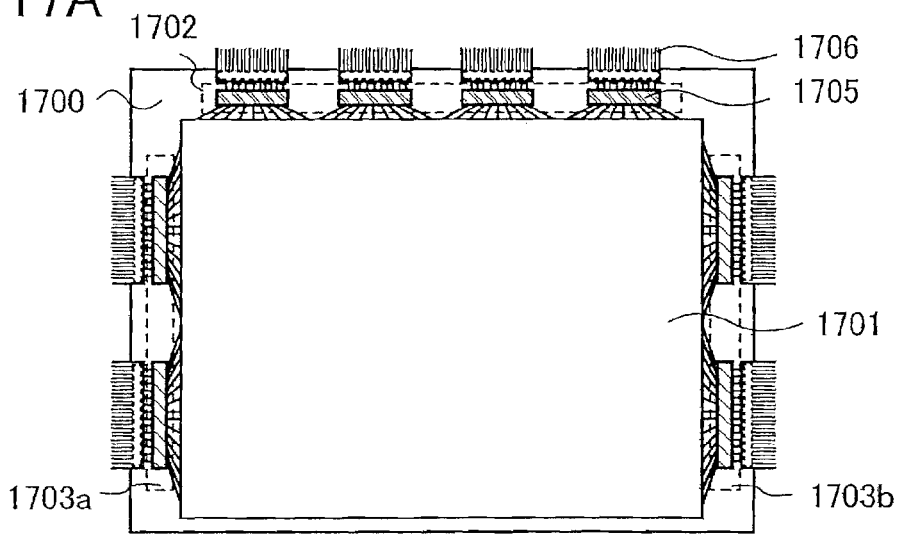
FIGS. 17A to 17C are top views each illustrating a semiconductor device of the present invention.

As shown in FIG. 17A, a source line driver circuit 1702 and gate line driver circuits 1703a and 1703b are mounted on the periphery of a pixel portion 1701. In FIG. 17A, IC chips 1705 are mounted on a substrate 1700 by a known mounting method using an anisotropic conductive adhesive or an anisotropic conductive film, a COG method, a wire bonding method, reflow treatment using a solder bump, or the like as the source line driver circuit 1702, the gate line driver circuits 1703a and 1703b, and the like. Here, a COG method is employed. Then, the IC chips are connected to external circuits through FPCs (Flexible Printed Circuits) 1706.

Note that a part of the source line driver circuit 1702, for example, an analog switch may be formed over a substrate, and the other part may be separately mounted as an IC chip.

Figure 17B:
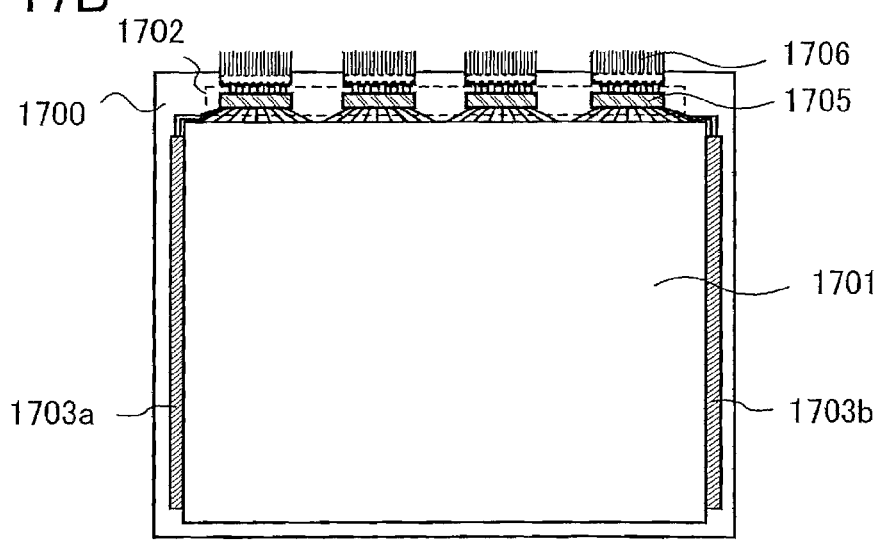

As shown in FIG. 17B, in the case of forming a TFT of a SAS or a crystalline semiconductor, a pixel portion 1701, gate line driver circuits 1703a and 1703b, and the like may be formed over a substrate, and a source line driver circuit 1702 and the like may be separately mounted as an IC chip. In FIG. 17B, IC chips 1705 are mounted on a substrate 1700 by a COG method as the source line driver circuit 1702. Then, the IC chips are connected to an external circuit through FPCs 1706.

Note that a part of the source line driver circuit 1702, for example, an analog switch may be formed over a substrate, and the other part may be separately mounted as an IC chip.

Figure 17C:
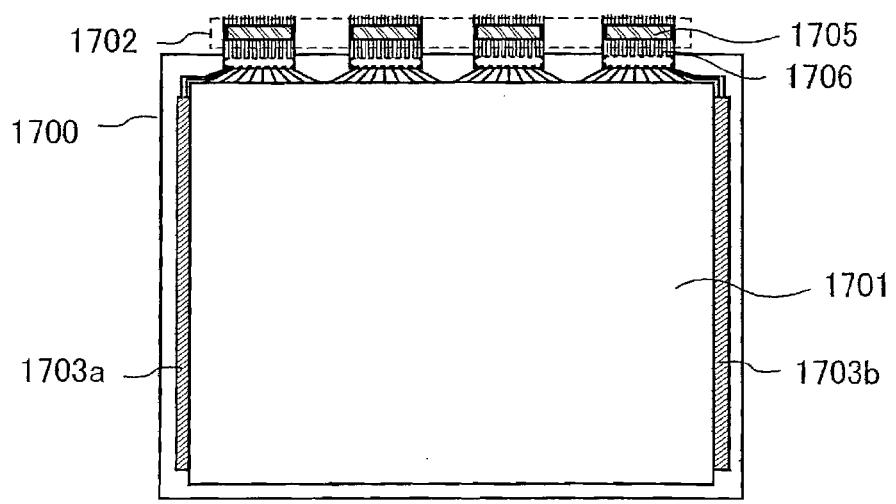

Further, as shown in FIG. 17C, a source line driver circuit 1702 and the like may be mounted by a TAB method instead of a COG method. Then, IC chips are connected to an external circuit through FPCs 1706. In FIG. 17C, the source line driver circuit is mounted by a TAB method; however, a gate line driver circuit may be mounted by a TAB method.

When the IC chip is mounted by a TAB method, the pixel portion can be largely provided with respect to the substrate, and a frame can be narrowed.

The IC chip comprises a silicon wafer, but in place of the IC chip, an IC in which a circuit is formed over a glass substrate (hereinafter referred to as a driver IC) may be provided. Since the IC chip is taken out of a circular silicon wafer, there is limitation on the shape of a mother substrate. On the other hand, the driver IC has a glass mother substrate and there is no limitation on the shape. Thus, productivity can be improved. Therefore, the dimension of the driver IC can be freely set. For example, when the driver IC is formed to have a long side of 15 mm to 80 mm in length, the necessary number of the driver ICs can be reduced compared to the case of mounting the IC chip. Accordingly, the number of connection terminals can be reduced and manufacturing yield can be improved.

The driver IC can be formed using a crystalline semiconductor layer over a substrate, and the crystalline semiconductor layer may be formed by irradiation with a continuous-wave laser beam or a pulsed laser beam with a repetition rate of 10 MHz or more. A semiconductor film formed by irradiation with a continuous-wave laser beam has few crystal defects and has crystal grains each with a large grain diameter. Accordingly, a transistor having such a semiconductor film has favorable mobility and response speed and high-speed drive thereof can be performed, which is suitable for the driver IC.

Figure 18:
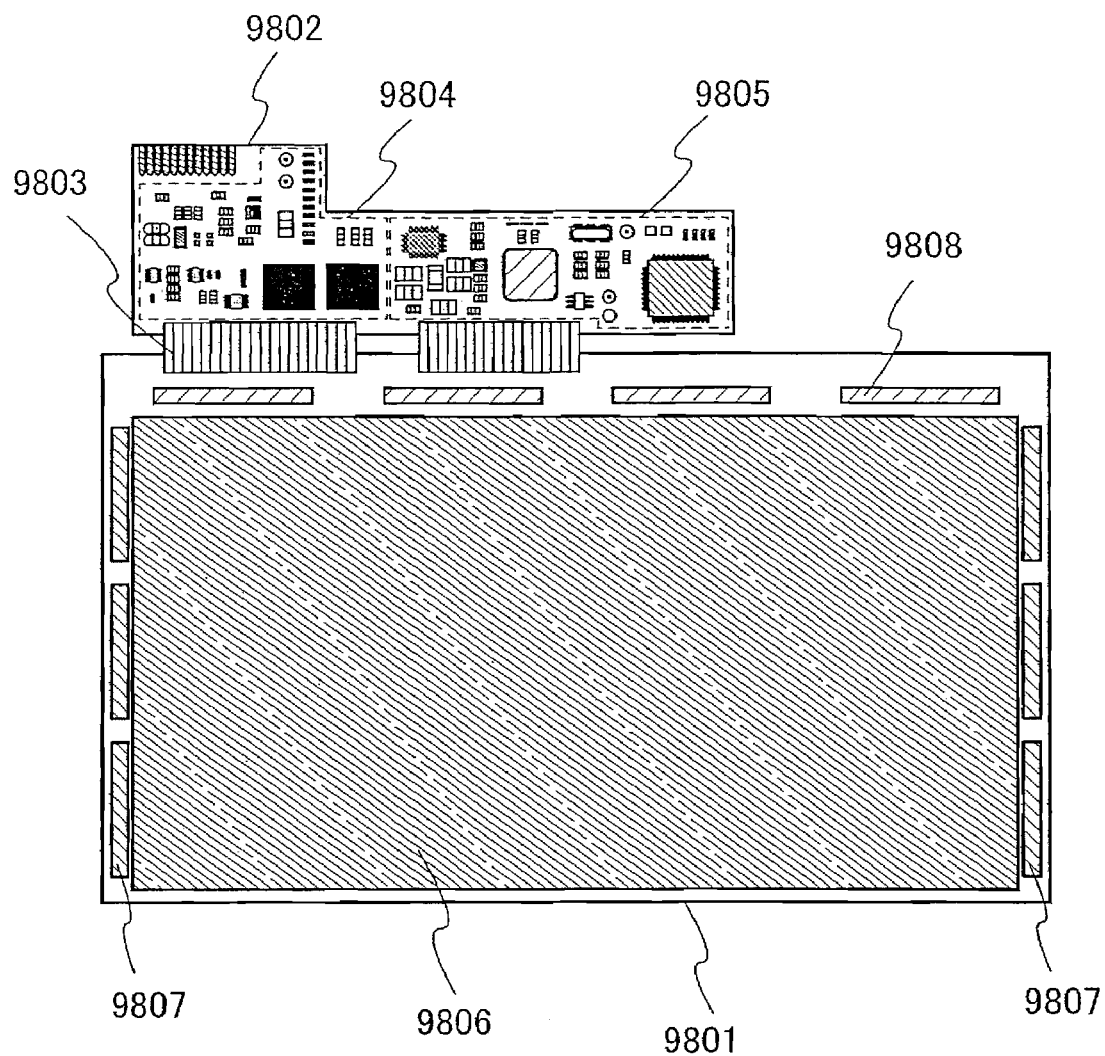
FIG. 18 is a top view illustrating a semiconductor device of the present invention.

Next, a module having the display panel described in the above embodiment modes is described with reference to FIG. 18. FIG. 18 shows a module in which a display panel 9801 and a circuit board 9802 are combined. Over the circuit board 9802, a control circuit 9804, a signal divider circuit 9805, and the like are formed, for example. In addition, the display panel 9801 and the circuit board 9802 are connected to each other by a connection wiring 9803. As the display panel 9801, the liquid-crystal display panel, the light-emitting display panel, the electrophoretic display panel, and the like as described in Embodiment Modes 3 to 5 can be used.

This display panel 9801 includes a pixel portion 9806 in which a light-emitting element is provided in each pixel, a scan line driver circuit 9807, and a signal line driver circuit 9808 which supplies a video signal to a selected pixel. The structure of the pixel portion 9806 is similar to those in Embodiment Modes 3 to 5. The scan line driver circuit 9807 and the signal driver circuit 9808 formed as IC chips are mounted on a substrate by a mounting method using an anisotropic conductive adhesive or an anisotropic conductive film, a COG method, a wire bonding method, reflow treatment using a solder bump, or the like.

According to this embodiment mode, a module including a display panel can be formed with high yield.

Embodiment Mode 7

Examples of electronic devices each of which includes the semiconductor device described in any of the above embodiment modes are as follows: a television device (also referred to as simply a television, or a television receiver), a camera such as a digital camera or a digital video camera, a cellular phone device (also referred to as simply a cellular phone or a cell phone), a portable information terminal such as a PDA, a portable game machine, a computer monitor, a computer, a sound reproducing device such as a car audio component, an image reproducing device including a recording medium such as a home-use game machine, and the like. Specific examples of such electronic devices are described with reference to FIGS. 19A to 19F.

Figure 19A:
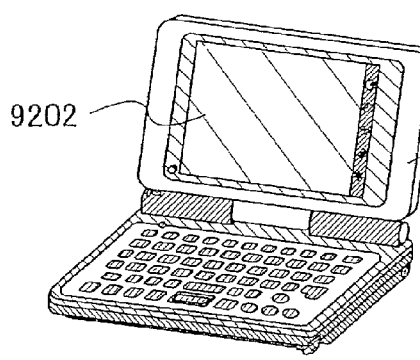
FIGS. 19A to 19F are perspective views each illustrating an electronic device using a semiconductor device of the present invention.

A portable information terminal shown in FIG. 19A includes a main body 9201, a display portion 9202, and the like. A high-performance portable information terminal can easily be manufactured by employing that described in the above embodiment mode in the display portion 9202.

Figure 19B:
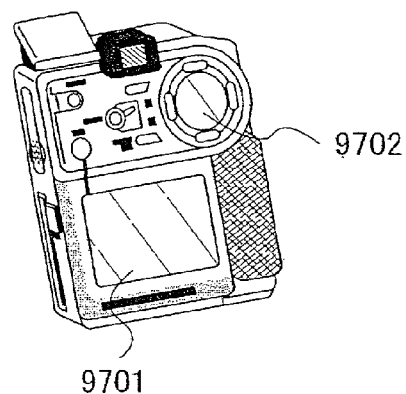

A digital video camera shown in FIG. 19B includes a display portion 9701, a display portion 9702, and the like. A high-performance digital video camera can easily be manufactured by employing that described in the above embodiment mode in the display portion 9701.

Figure 19C:
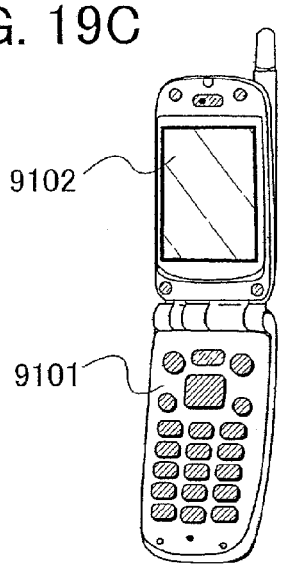

A portable terminal shown in FIG. 19C includes a main body 9101, a display portion 9102, and the like. A high-performance portable terminal can easily be manufactured by employing that described in the above embodiment mode in the display portion 9102.

Figure 19D:
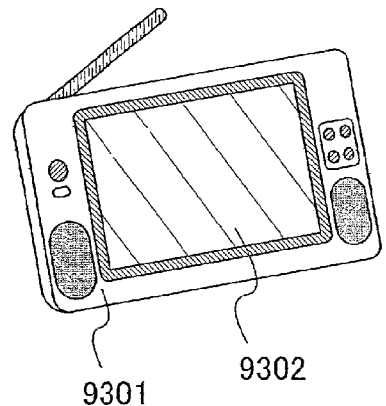

A portable television device shown in FIG. 19D includes a main body 9301, a display portion 9302, and the like. A high-performance portable television device can easily be manufactured by employing that described in the above embodiment mode in the display portion 9302. Such a television device can be applied to a wide range of television devices ranging from a small television device mounted on a portable terminal such as a cellular phone, a medium television device which can be carried, to a large (for example, 40-inch or larger) television device.

Figure 19E:
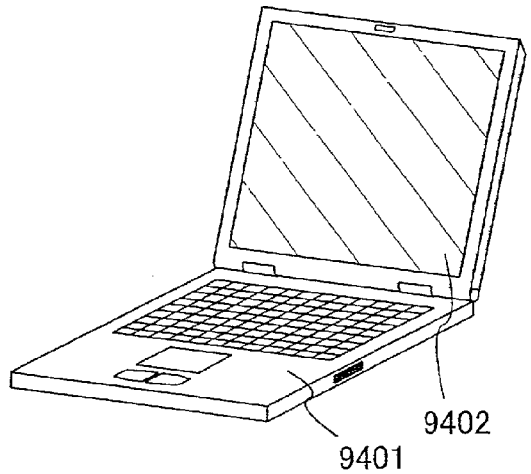

A portable computer shown in FIG. 19E includes a main body 9401, a display portion 9402, and the like. A high-performance portable computer can easily be manufactured by employing that described in the above embodiment mode in the display portion 9402.

Figure 19F:
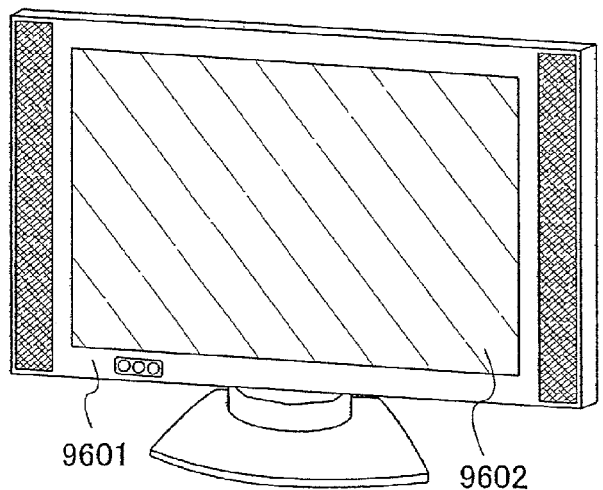

A television device shown in FIG. 19F includes a main body 9601, a display portion 9602, and the like. A high-performance television device can easily be manufactured by employing that described in the above embodiment mode in the display portion 9602.

Here, the structure of the television device is described with reference to FIG. 20.

Figure 20:
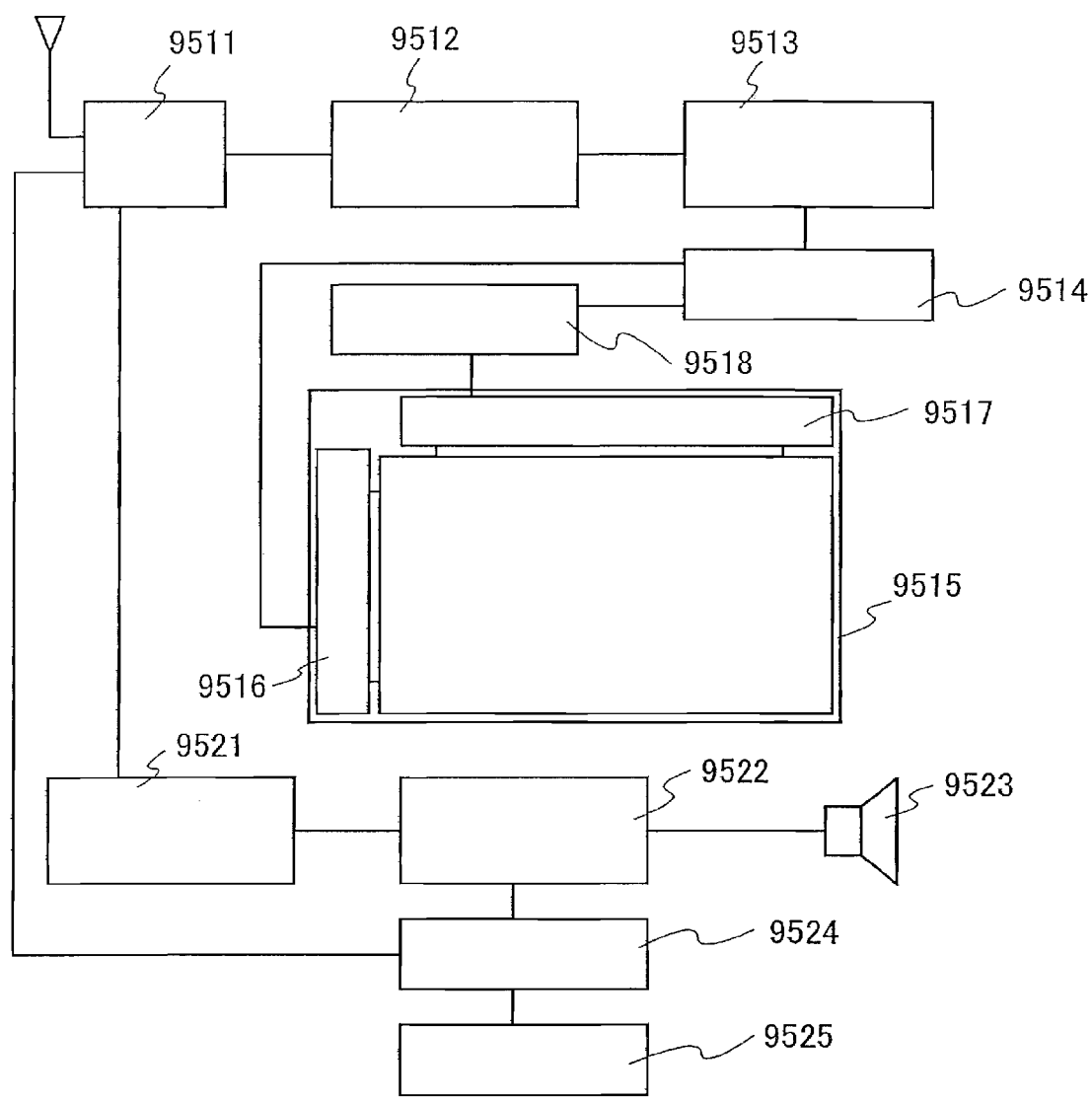
FIG. 20 is a diagram illustrating an electronic device using a semiconductor device of the present invention.

FIG. 20 is a block diagram which shows main components of the television device. A tuner 9511 receives video signals and audio signals. The video signals are processed by a video signal detection circuit 9512, a video signal processing circuit 9513 that converts signals outputted from the video signal detection circuit 9512 into chrominance signals corresponding to each color of red, green, and blue, and a control circuit 9514 that converts the video signals into input specifications of a driver IC. The control circuit 9514 outputs signals to both a scan line driver circuit 9516 and a signal line driver circuit 9517 of a display panel 9515. In the case of digital driving, a signal divider circuit 9518 may be provided on the signal line side to divide an input digital signal into m pieces and supply the divided signals.

Note that the TFT described in the above embodiment mode can be used in each circuit of the television device. In the TFT described in the above embodiment mode, an opening (contact hole) between wirings can be formed with the use of a femtosecond laser, without using a complicated photolithography step, and favorable electrical contact of wirings can be obtained. Accordingly, a high-performance and high-reliability television device can be manufactured with less material loss and with high yield.

In FIG. 20, among the signals received by the tuner 9511, the audio signals are transmitted to an audio signal detection circuit 9521, and the output thereof is supplied to a speaker 9523 through an audio signal processing circuit 9522. A control circuit 9524 receives control information on a receiving station (a receiving frequency) or sound volume from an input portion 9525 and transmits the signal to the tuner 9511 or the audio signal processing circuit 9522.

Since this television device includes the display panel 9515, it can achieve a reduction in its power consumption.

Note that the present invention is not limited to a television receiver and is also applicable to various applications such as a monitor of a personal computer, and particularly a display medium having a large area like an information display board at a train station, an airport, or the like, or an advertisement display board on the street.

This application is based on Japanese Patent Application serial no. 2006-235519 filed in Japan Patent Office on Aug. 31, 2006, the entire contents of which are hereby incorporated by reference.

What is claimed is:

1. A semiconductor device comprising:
   a first substrate;
   a thin film transistor over the first substrate;
   a wiring over the thin film transistor, the wiring having a first opening portion;
   an insulating layer on the wiring, the insulating layer having a second opening portion; and
   a conductive layer in the first opening portion and the second opening portion, and on the insulating layer,
   wherein the first opening portion is larger than the second opening portion,
   wherein the conductive layer is through the first opening portion and the second opening portion, wherein the second opening portion overlaps with the first opening portion at least partly, and wherein the conductive layer is electrically connected to the thin film transistor.

2. The semiconductor device according to claim 1, wherein the thin film transistor is selected from an inverted-staggered thin film transistor, a staggered thin film transistor, or a coplanar thin film transistor.

3. The semiconductor device according to claim 1, wherein the wiring comprises at least one of chromium, molybdenum, nickel, titanium, cobalt, copper, and aluminum.

4. The semiconductor device according to claim 1, wherein the insulating layer is a light-transmitting layer.

5. The semiconductor device according to claim 1, wherein the insulating layer is a light-transmitting organic resin layer.

6. A semiconductor device comprising:
a first substrate;
a thin film transistor over the first substrate;
a wiring over the thin film transistor, the wiring having a first opening portion;
an insulating layer on the wiring, the insulating layer having a second opening portion; and
a conductive layer in the first opening portion and the second opening portion, and on the insulating layer,
wherein the first opening portion is larger than the second opening portion,
wherein the conductive layer is through the first opening portion and the second opening portion,
wherein the second opening portion is inside the first opening portion, and
wherein the conductive layer is electrically connected to the thin film transistor.

7. The semiconductor device according to claim 6, wherein the thin film transistor is selected from an inverted-staggered thin film transistor, a staggered thin film transistor, or a coplanar thin film transistor.

8. The semiconductor device according to claim 6, wherein the wiring comprises at least one of chromium, molybdenum, nickel, titanium, cobalt, copper, and aluminum.

9. The semiconductor device according to claim 6, wherein the insulating layer is a light-transmitting layer.

10. The semiconductor device according to claim 6, wherein the insulating layer is a light-transmitting organic resin layer.

11. An electrophoretic element comprising:
a first substrate;
a thin film transistor over the first substrate;
a wiring over the thin film transistor, the wiring having a first opening portion;
an insulating layer on the wiring, the insulating layer having a second opening portion,
a first conductive layer in the first opening portion and the second opening portion, and on the insulating layer,
microcapsules on the first conductive layer;
a second conductive layer on the microcapsules; and
a second substrate on the second conductive layer,
wherein the first opening portion is larger than the second opening portion,
wherein the first conductive layer is through the first opening portion and the second opening portion,
wherein the second opening portion overlaps with the first opening portion at least partly,
wherein the first conductive layer is electrically connected to the thin film transistor, and
wherein the microcapsule comprises a fine transparent container which includes charged particles and a transparent dispersion medium.

12. The electrophoretic element according to claim 11, wherein the thin film transistor is selected from an inverted-staggered thin film transistor, a staggered thin film transistor, or a coplanar thin film transistor.

13. The electrophoretic element according to claim 11, wherein the wiring comprises at least one of chromium, molybdenum, nickel, titanium, cobalt, copper, and aluminum.

14. The electrophoretic element according to claim 11, wherein the insulating layer is a light-transmitting layer.

15. The electrophoretic element according to claim 11, wherein the insulating layer is a light-transmitting organic resin layer.

16. An electrophoretic element comprising:
a first substrate;
a thin film transistor over the first substrate;
a wiring over the thin film transistor, the wiring having a first opening portion;
an insulating layer on the wiring, the insulating layer having a second opening portion,
a first conductive layer in the first opening portion and the second opening portion, and on the insulating layer,
microcapsules on the first conductive layer;
a second conductive layer on the microcapsules; and
a second substrate on the second conductive layer,
wherein the first opening portion is larger than the second opening portion,
wherein the first conductive layer is through the first opening portion and the second opening portion,
wherein the second opening portion is inside the first opening portion,
wherein the first conductive layer is electrically connected to the thin film transistor,
wherein the microcapsule comprises a fine transparent container which includes charged particles and a transparent dispersion medium.

17. The electrophoretic element according to claim 16, wherein the thin film transistor is selected from an inverted-staggered thin film transistor, a staggered thin film transistor, or a coplanar thin film transistor.

18. The electrophoretic element according to claim 16, wherein the wiring comprises at least one of chromium, molybdenum, nickel, titanium, cobalt, copper, and aluminum.

19. The electrophoretic element according to claim 16, wherein the insulating layer is a light-transmitting layer.

20. The electrophoretic element according to claim 16, wherein the insulating layer is a light-transmitting organic resin layer.

* * * * *